(12) United States Patent
Terazawa et al.

(10) Patent No.: US 7,330,144 B2
(45) Date of Patent: Feb. 12, 2008

(54) ANALOG-TO-DIGITAL CONVERSION METHOD AND ANALOG TO DIGITAL CONVERTER

(75) Inventors: Tomohito Terazawa, Gifu (JP); Takamoto Watanabe, Nagoya (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 11/543,259

(22) Filed: Oct. 5, 2006

(65) Prior Publication Data

US 2007/0080844 A1    Apr. 12, 2007

(30) Foreign Application Priority Data

Oct. 6, 2005   (JP)   ............... 2005-293629

(51) Int. Cl.
*H03M 1/60* (2006.01)
*H03M 1/12* (2006.01)

(52) U.S. Cl. .................. 341/157; 341/118; 341/155; 341/166

(58) Field of Classification Search ................. 341/157
See application file for complete search history.

(56) References Cited

U.S. PATENT DOCUMENTS 5,396,247 A    3/1995   Watanabe et al.

6,850,178 B2 *   2/2005   Watanabe ................. 341/155
6,891,491 B2     5/2005   Nakamura et al.
7,106,239 B1 *   9/2006   Keskin ..................... 341/157

FOREIGN PATENT DOCUMENTS

JP   H05-259907   10/1993
JP   2004-274157   9/2004

* cited by examiner

*Primary Examiner*—Khai M Nguyen
(74) *Attorney, Agent, or Firm*—Posz Law Group, PLC

(57) ABSTRACT

In an analog-to-digital converter, a generating unit executes analog-to-digital conversion of a first input signal and a second input signal based on an analog-to-digital conversion characteristic curve to generate first digital data and second digital data respectively corresponding to the first input signal and the second input signal. The input signal has a first level, and the first level is the sum of an offset level and a level of a target analog signal for analog-to-digital conversion. The second input signal has a second level, and the second level is generated by subtracting the offset level from the level of the target analog signal. In the analog-to-digital converter, an obtaining unit obtains difference digital data between the first digital data and the second digital data to output the obtained difference digital data as digital data of the target analog signal.

25 Claims, 11 Drawing Sheets

ANALOG-TO-DIGITAL CONVERSION METHOD AND ANALOG TO DIGITAL CONVERTER

CROSS REFERENCE TO RELATED APPLICATIONS

This application is based on Japanese Patent Application 2005-293629 filed on Oct. 6, 2005. This application claims the benefit of priority from the Japanese Patent Application, so that the descriptions of which are all incorporated herein by reference.

FIELD OF THE INVENTION

The present invention relates to analog-to-digital (A/D) conversion methods and A/D converters, which are designed to convert an analog input signal into digital data using a non-linear A/D conversion characteristic.

BACKGROUND OF THE INVENTION

As high-resolution analog to digital converters with a simple circuit structure, time analog to digital converters, referred to as TAD converters, have been conventionally developed. Examples of the TAD converters are disclosed in U.S. Pat. No. 5,396,247 corresponding to Japanese Unexamined Patent Publication No. H05-259907.

One typical example of the TAD converters of the U.S. patent publication includes a pulse delay circuit composed of a plurality of delay units that corresponds to a plurality of stages of delay. The delay units are serially connected to one another in a ring-like structure.

In the TAD converter, when a pulse signal is input to one of the delay units corresponding to the first stage of delay, a pulse signal is sequentially transferred by the delay units while being delayed thereby in the order from the first stage of delay units toward the last stage thereof. On the other hand, an analog voltage signal as a target for A/D conversion is input to each delay unit as power supply voltage, so that the delay time of each delay unit depends on the level of the power supply voltage (the analog voltage signal) supplied to each delay unit.

Specifically, the TAD converter is designed to:

count a number of stages (pulse delay units) through which the pulse signal has passed within a predetermined sampling period during circulation; this number of pulse delay units though which the pulse signal has passed within the predetermined sampling period depends on the level of the input analog voltage signal; and obtain digital data corresponding to the level of the input analog voltage signal based on the counted number of stages (pulse delay units).

As described above, the TAD converter is designed to change the delay time of each delay unit based on the level of the input analog voltage signal, and to detect the level of the input analog voltage signal by counting the number of delay units through which the pulse signal has passed. Because the change in the delay time of each delay unit is nonproportional to that in the level of the input analog voltage signal supplied to each delay unit, the A/D converter output is not linearly changed depending on the change in the level of the input analog voltage signal. This causes the TAD to have nonlinear input-output characteristics, in other words, an input-output characteristic curve.

In view of the foregoing circumstances, methods of correcting the input-output characteristic curve of the TAD have been proposed. Examples of the correcting methods are disclosed in U.S. Pat. No. 6,891,491 corresponding to Japanese Unexamined Patent Publication No. 2004-274157.

One typical example of the correcting methods of the U.S. Patent Publication is configured to:

divide the input range of an analog voltage signal into a plurality of areas;

approximate, by a line, an input-output characteristic curve of a TAD within each of the divided input voltage areas;

derive a conversion equation for converting a coordinate point on the approximated line within each of the divided input voltage areas into a coordinate point on an ideal input-output characteristic line; and correct the output digital value of the TAD with respect to each of the input voltage areas using the conversion equation.

Another typical example of the correcting methods of the U.S. Patent Publication is configured to:

obtain an M number of coordinate points by actually converting an input analog voltage signal into digital data with the use of a TAD;

express an input-output characteristic curve of the TAD by an n-th polynomial expression ($n \leq M-1$); and derive a conversion expression for converting the output digital values of the TAD into digital values on an ideal input-output characteristic line of the TAD based on the n-th polynomial expression.

Because the correcting methods set forth above need to derive the conversion expression for conversion of the output of the TAD, it may be desired to correct the output digital values of the TAD without using such conversion expressions, thereby converting them into digital values on an ideal input-output characteristic line of the TAD.

SUMMARY OF THE INVENTION

In view of the background, an object of at least one aspect of the present invention is, in the conversion of an analog input signal into digital data with the use of, for example, a nonlinear A/D conversion characteristic, to allow the digital data to be substantially proportional to the analog input signal without the need of deriving conversion expressions for converting the nonlinear A/D conversion characteristic into an ideal linear input-output characteristic.

According to one aspect of the present invention, there is provided an analog-to-digital conversion method. The method includes executing analog-to-digital conversion of a first input signal and a second input signal based on an analog-to-digital conversion characteristic curve to generate first digital data and second digital data respectively corresponding to the first input signal and the second input signal. The first input signal has a first level, and the first level is the sum of an offset level and a level of a target analog signal for analog-to-digital conversion. The second input signal has a second level, and the second level is generated by subtracting the offset level from the level of the target analog signal. The method also includes obtaining difference digital data between the first digital data and the second digital data to output the obtained difference digital data as digital data of the target analog signal.

According to another aspect of the present invention, there is provided an analog-to digital conversion method.

The method includes executing analog-to-digital conversion of a first input signal based on an analog-to-digital conversion characteristic curve to generate first digital data. The first input signal has a first level, and the first level is the sum of an offset level and a level of a target analog signal for analog-to-digital conversion. The method also includes subtracting the first level of the first input signal from double of the offset level to generate a second input signal, and executing analog-to-digital conversion of the second input signal based on the analog-to-digital conversion characteristic curve to generate second digital data. The method further includes obtaining difference digital data between the first digital data and the second digital data to output the obtained difference digital data as digital data of the target analog signal.

According to a further aspect of the present invention, there is provided an analog-to-digital converter. The converter includes a generating unit configured to execute analog-to-digital conversion of a first input signal and a second input signal based on an analog-to-digital conversion characteristic curve to generate first digital data and second digital data respectively corresponding to the first input signal and the second input signal. The first input signal has a first level, and the first level is the sum of an offset level and a level of a target analog signal for analog-to-digital conversion. The second input signal has a second level, and the second level is generated by subtracting the offset level from the level of the target analog signal. The converter further includes an obtaining unit configured to obtain difference digital data between the first digital data and the second digital data to output the obtained difference digital data as digital data of the target analog signal.

According to a still further aspect of the present invention, there is provided an analog-to-digital converter. The converter includes a generating unit configured to execute analog-to-digital conversion of a first input signal based on an analog-to-digital conversion characteristic curve to generate first digital data. The first input signal has a first level, and the first level is the sum of an offset level and a level of a target analog signal for analog-to-digital conversion. The generating unit is configured to subtract the first level of the first input signal from double of the offset level to generate a second input signal, and to execute analog-to-digital conversion of the second input signal based on the analog-to-digital conversion characteristic curve to generate second digital data. The converter also includes an obtaining unit configured to obtain difference digital data between the first digital data and the second digital data to output the obtained difference digital data as digital data of the target analog signal.

BRIEF DESCRIPTION OF THE DRAWINGS

Other objects and aspects of the invention will become apparent from the following description of embodiments with reference to the accompanying drawings in which.

DETAILED DESCRIPTION OF EMBODIMENTS OF THE INVENTION

Embodiments of the present invention will be described hereinafter with reference to the accompanying drawings.

First Embodiment

Figure 1:
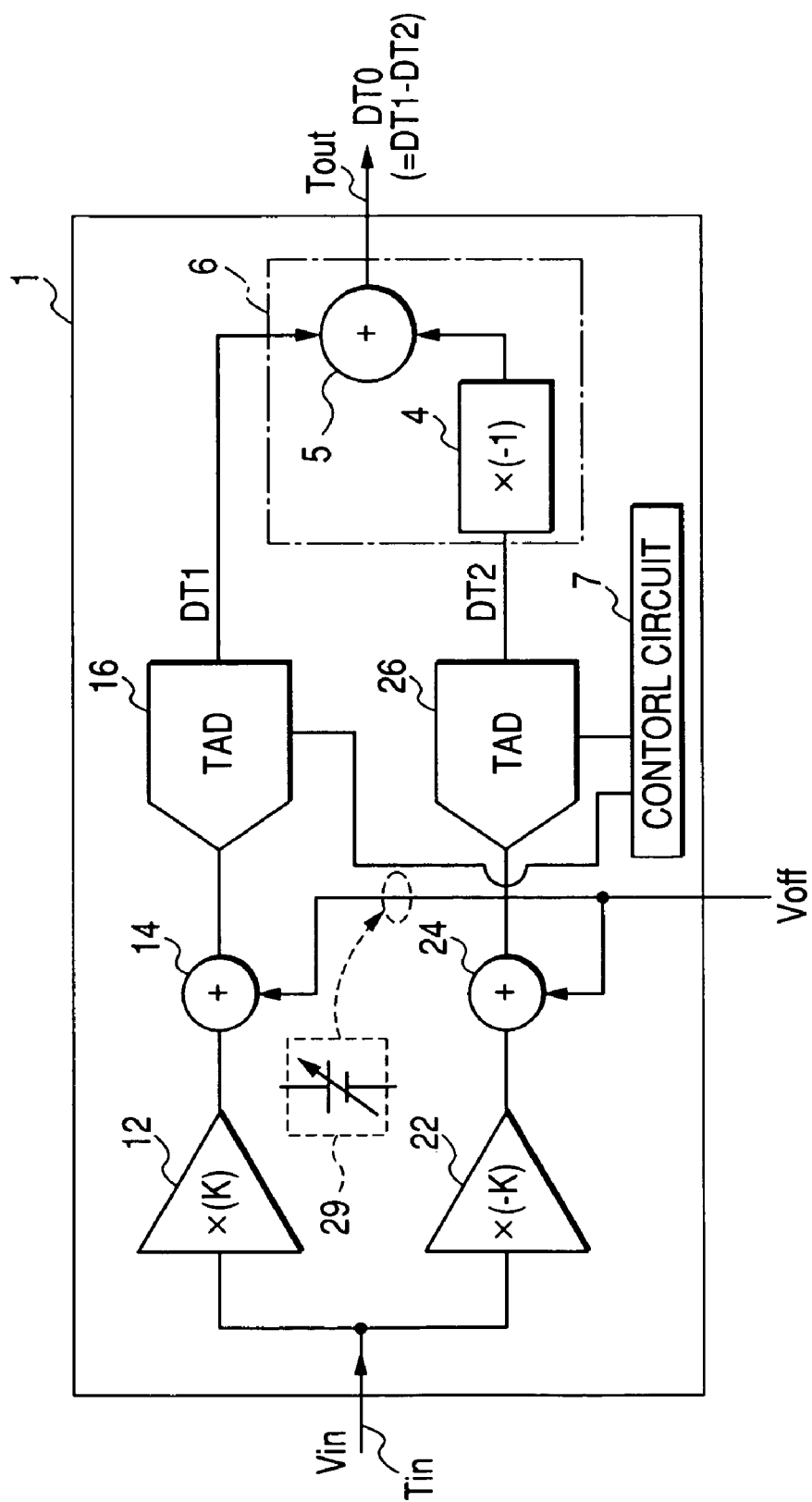
FIG. 1 is a circuit diagram schematically illustrating an example of the overall structure of an analog to digital (A/D) converter according to a first embodiment to which the present invention is applied.

Referring to the drawings, in which like reference characters refer to like parts in several views, FIG. 1 illustrates an example of the overall structure of an analog to digital (A/D) converter 1 according to a first embodiment to which the present invention is applied.

As illustrated in FIG. 1, the analog to digital converter, referred to simply as A/D converter, 1 is composed of an input terminal Tin, an output terminal Tout, a pair of first and second separate input lines 1a and 1b, and a pair of first and second amplifiers 12 and 22.

The A/D converter 1 is also composed of a pair of first and second adders 14 and 24, a pair of first and second time analog to digital converters 16 and 26, a subtractor (SUB) 6, and a control circuit (CC) 7. The first and second time analog to digital converting modules 16 and 26 will be referred to simply as first and second A/D converting modules 16 and 26" hereinafter.

The A/D converter 1 is configured such that an analog voltage Vin with a voltage level of "Vin" as its A/D conversion target is input hereto through the input terminal Tin. Specifically, the input terminal Tin of the A/D converter 1 is electrically connected to each of the first and second input lines thereof. The first and second input lines are electrically connected to respective input terminals of the first and second amplifiers 12 and 22.

Output terminals of the first and second amplifiers 12 and 22 are electrically connected to respective input terminals of the first and second adders 14 and 24. Output terminals of the first and second adders 14 and 24 are electrically connected to respective input terminals of the first and second A/D converting modules 16 and 26. Output terminals of the first and second A/D converting modules 16 and 26 are electrically connected to respective input terminals of the subtractor 6. An output terminal of the subtractor 6 is electrically connected to the output terminal Tout of the A/D converter 1.

In the first embodiment, the components 6, 12, 14, 16, 22, 24, and 26 are integrally mounted on/in a circuit board.

Upon input of the analog input voltage Vin into the A/D converter 1 through its input terminal Tin, the analog input voltage Vin is separated by the first and second input lines 1a and 1b to be fed respectively to the first and second amplifiers 12 and 22.

The first and second amplifiers 12 and 22 respectively have positive and negative gains of equal magnitude. For example, the first amplifier 12 has the positive gain K, and the second amplifier 22 has the negative gain −K whose magnitude is equal to that of the positive gain K.

One of the separated analog voltage signals fed to the first amplifier 12 is amplified thereby at the positive gain K to be supplied to the first adder 14 as an analog input voltage whose voltage level is referred to as "+Vin". Similarly, the other of the separated analog voltage signals fed to the second amplifier 22 is amplified thereby at the negative gain −K to be supplied to the second adder 24 as an analog input voltage whose voltage level is referred to as "−Vin".

By the first and second adders 14 and 24, an adjustable offset voltage Voff whose voltage level is "Voff" is added to the respective voltage levels (+Vin and −Vin) of the analog input voltages so that a first voltage "Voff+Vin" and a second voltage "Voff−Vin" are generated.

For example, the control circuit 7 can generate the offset voltage Voff and apply it to each of the first and second adders 14 and 24. Moreover, an voltage regulator or the like can be provided for generating the offset voltage Voff and applying it to each of the first and second adders 14 and 24.

The generated first voltage (Voff+Vin) and the generated second voltage (Voff−Vin) are respectively input to the first A/D converting module 16 and the second A/D converting module 26. The first and second voltages are respectively converted by the first and second A/D converting modules 16 and 26 into first digital data DT1 and second digital data DT2.

The subtractor 6 is composed of a multiplier 4 and an adder 5. The first digital data DT1 and the second digital data DT2 are configured to be input to the adder 5 and multiplier 4, respectively.

The multiplier 4 is configured to multiply the second digital data DT2 by "−1", thereby inverting the sign of the second digital data corresponding to the second voltage (Voff−Vin). The second digital data DT2 whose sign is inverted is input to the adder 5.

By the adder 5, the second digital data DT2a after sign inversion and the first digital data DT1 corresponding to the first voltage (Voff+Vin) are added to each other. The sum of the second digital data DT2a after sign inversion and the first digital data DT1 means that the second digital data DT2 is subtracted from the first digital date DT1. The result of addition corresponding to the difference between the first digital data DT1 and the second digital data DT2) represented by "DT1−DT2" is configured to be output from the output terminal Tout of the A/D converter 1 as A/D conversion data DT0 of the analog input voltage Vin.

Next, an example of the schematic structure of each of the first and second A/D converting modules 16 and 26 will be described.

Preferably, each of the first and second A/D converting modules 16 and 26 is designed as a pulse phase difference coding circuit, such as a time analog to digital converter (TAD).

Figure 2:
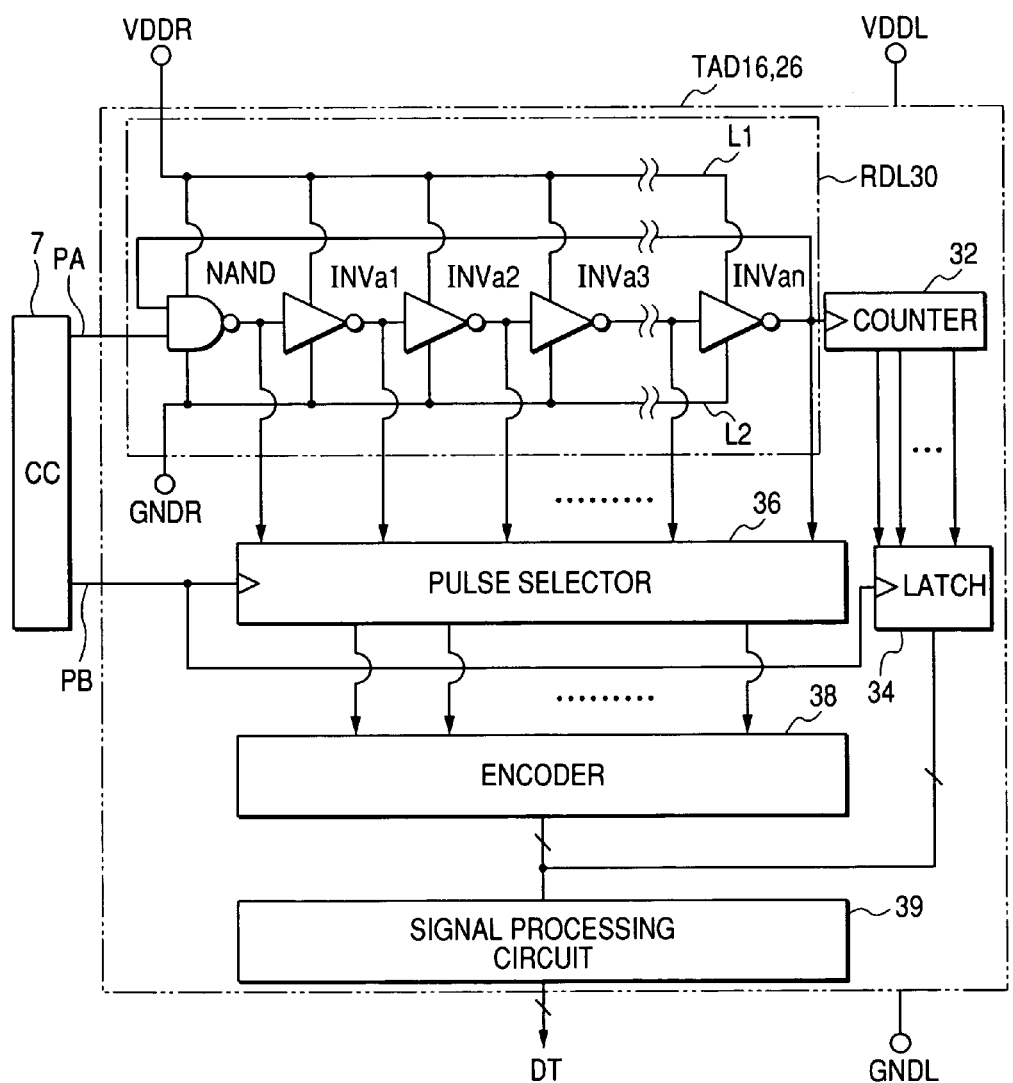
FIG. 2 is a block diagram schematically illustrating an example of the overall structure of each of first and second A/D converting modules illustrated in FIG. 1.

Specifically, as illustrated in FIG. 2, each of the first and second A/D converting modules 16 and 26 includes a pulse delay circuit, in other words, a ring delay line (RDL) 30. The pulse delay circuit 30 is composed of a preferably odd number of delay units that corresponds to a corresponding odd number of stages of delay. Specifically, as the odd number of inverting circuits, a NAND gate NAND and an even number of inverters INVa1 to INVan (n: even number equal to or more than 2) are preferably used.

The NAND gate NAND has one and the other input terminals and one output terminal, and is designed such that a cyclic pulse signal PA is input from the control circuit 7 to the one input terminal thereof.

The NAND gate NAND and the inverters INVa1 to INVan are connected in series in a ring. That is, the other input terminal of the NAND gate NAND and an output terminal of the final stage of inverter INVan are connected to each other so that the NAND gate NAND and the inverters INVa1 to INVan are serially connected to have a ring-like structure, constituting the ring delay line 30.

While the level of the pulse signal PA is a low level, the NAND gate NAND, which serves as the first stage of delay, outputs a pulse signal whose level is high. The inverter INVa1 inverts the output pulse signal to output a pulse signal whose level is low. Each of the remaining inverters INVa2 to INVan (stages of delay) sequentially inverts a pulse signal output from the previous inverter.

Because the number of the delay units of the pulse delay circuit 30 is the odd number, the level of the pulse signal output from the last stage of inverter INVan is high. Specifically, while the level of the pulse signal PA is the low level, each of the levels of the output pulse signals from the delay units of the pulse delay circuit 30 is constant.

When the level of the pulse signal PA is turned to a high level, the NAND gate NAND starts to operate. That is, the NAND gate NAND outputs a pulse signal whose level is inverted to the low level because the level of the pulse signal input to the other input terminal of the NAND gate NAND is high. This indicates that the pulse signal PA shifts to the output of the inverter INVa1.

The inverter INVa1 inverts the output pulse signal to output a pulse signal whose level is high. Each of the remaining inverters INVa2 to INVan sequentially inverts a pulse signal output from the previous inverter to output it so that the levels of the pulse signals output from the inverters INVa2 to INVan are inverted as compared with the case when the level of the pulse signal PA is the low level.

As a result, the level of the pulse signal output from the last stage of inverter INVan is inverted to the low level.

Subsequently, when the pulse signal whose level is low is input to the other input terminal of the NAND gate NAND, the level of the output signal from the NAND gate NAND is inverted to the high level. This results in that the level of the output signal from the inverter INVa1 is turned to the low level and therefore, the level of the output signal from the inverter INVa2 is turned to the high level. This represents that the pulse signal PA shifts to the output of the inverter INVa2.

Specifically, in response to the rising edge of the pulse signal PA, the riding edge of the pulse signal PA is sequentially circulated through the delay units of the pulse delay circuit 30 while the level of the pulse signal PA is the high level.

These inverting operations of the delay units (NAND and INVa1 to an) of the pulse delay circuit 30 require respectively predetermined delay times, so that the delay units NAND and INVa1 to INVan circulate the rising edge of the pulse signal PA while delaying it at the predetermined delay times, respectively.

Each of the A/D converting modules 16 and 26 includes a counter 32 serving as a coding circuit and electrically connected to the output terminal of the final stage of the inverter INVan.

The counter 32 is operative to:

count the number of inversion of the output level of the final stage of the inverter INVan;

obtain the number of times of the circulation of the rising edge of the pulse signal PA through the circularly connected NAND gate NAND and the inverters INVa1 to INVan based on the counted number; and convert the obtained number of times of the circulation of the rising edge of the pulse signal PA into predetermined bits of binary digital data as an example of numeric data.

Each of the A/D converting modules 16 and 26 also includes a latch 34 electrically connected to the control circuit 7 and the counter 32. The periodic pulse signal PB is input to the latch 34.

Specifically, the latch 34 starts to operate when the level of the pulse signal PB is turned to a high level, thereby latching the predetermined bits of binary digital data output from the counter 32.

Each of the A/D converting modules 16 and 26 includes a pulse selector 36 electrically connected respectively to the output terminals of the NAND gate NAND and the inverters INVa1 to INVan.

The pulse selector 36 is operative to, when the level of the pulse signal PB is turned to the high level, detect a circulation position at which the rising edge of the pulse signal PA has reached in the pulse delay circuit 30 based on the output levels of the NAND gate NAND and the inverters INVa1 to INVan. The pulse selector 36 is also operative to output a signal indicative of the circulation position of the rising edge of the pulse signal PA.

Each of the A/D converting modules 16 and 26 includes en encoder 38 electrically connected to the pulse selector 36.

The encoder 38 is operative to convert the signal output from the pulse selector 16 into predetermined bits of binary digital data as an example of numeric data.

The pulse selector 36 includes a signal processing circuit 39 electrically connected to the latch 34 and the encoder 38.

The signal processing circuit 39 is operative to:

input the predetermined bits of binary digital data output from the latch 34 as higher-order bits;

input the predetermined bits of binary digital data output from the encoder 38 as lower-order bits; and combine the higher-order bits and the lower-order bits, thereby generating binary digital data DT.

That is, the first A/D converting module 16 is configured to output the generated digital data DT as the first digital data DT1, and the second A/D converting module 26 is configured to output the generated digital data DT as the second digital data DT2.

The binary digital data DT represents the number of delay units (NAND gate and inverters) through which the rising edge of the pulse signal PA has passed for a predetermined period determined by the cycle of the pulse signal PB.

Note that the A/D converting modules 16 and 26 are well known as pulse phase difference coding circuits and/or time A/D converters. Specifically, an example of the detailed structure of each of the A/D converting modules 16 and 26 has been described in, for example, U.S. Patent Publications U.S. Pat. Publication No. 5,396,247, No. 6,771,202 B2, and No. 6,891,491.

Figure 3:
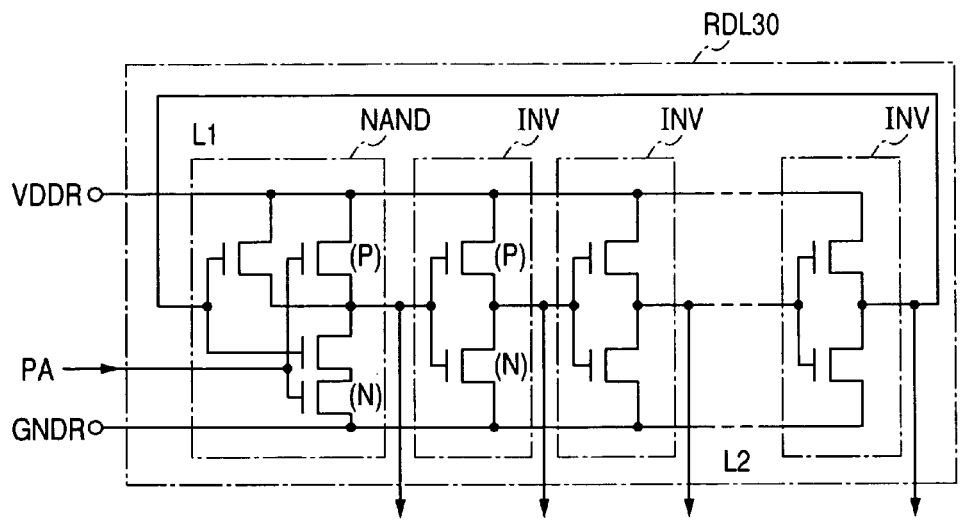
FIG. 3 is a circuit diagram schematically illustrating an example of a pulse delay circuit (ring delay line) illustrated in FIG. 2.

Preferably, as illustrated in FIG. 3, the NAND gate NAND is designed as a CMOS NAND gate consisting of two P channel transistors (P-channel MOSFETs) in parallel connected to two N channel transistors (N-channel MOSFETs) connected to each other in series. Similarly, as illustrated in FIG. 3, the inverters INVa1 to INVan are also designed as CMOS inverters each consisting of a P channel transistor (P-channel MOSFET) and N channel transistor (P-channel MOSFET) connected thereto in series.

Specifically, a positive power supply line L1 and a negative power supply line (ground line) are electrically connected to each of the delay units NAND and INVa1 to INVan. The positive power supply line L1 has a power supply terminal VDDR, and the ground line L2 has a ground terminal GNDR.

To the power supply terminal VDDR, a predetermined positive power supply voltage Vcc at the power supply terminal is configured to be applied, and a voltage level at the ground terminal GNDR is set to be lower than the power supply voltage Vcc. This allows each of the delay units NAND and IVNa1 to INVan to transfer the pulse signal PA while delaying it at a delay time depending on the voltage between the power supply terminal VDDR and the ground terminal GNDR.

For example, the NAND gate NAND operates as follows:

When at least one of the pulse signal PA and the pulse signal PB is low, a corresponding at least one of the PMOSPETs is on, so that a corresponding at least one of the NMOSFETs is off. This allows the output of the NAND gate NAND to be high.

In contrast, when both of the pulse signal PA and the pulse signal PB are high, the PMOSFETs are off, so that the NMOSFETs are on. This allows the output of the NAND gate NAND to be low.

Moreover, each of the inverters INVa1 to INVan operates as follows:

When the pulse signal input thereto is high, the NMOSFET is on, so that the output of each of the inverters INa1 to INVan is high.

In contrast, when the pulse signal input thereto is low, the PMOSFET is on, so that the output of each of the inverters INVa1 to INVan is low.

The A/D converter 1 according to the first embodiment is configured such that:

the first and second voltages generated by the first and second amplifiers 12 and 22 and by the first second adders 14 and 24 are applied to the power supply terminal VDDR of each of the delay units NAND and INVa1 to INVan; and the ground terminal GNDR of each of the delay units NAND and INVa1 to INVan is connected, together with a ground terminal GNDL of each of the remaining logic elements of the first and second A/D converting modules 16 and 26, to the ground of the A/D converter 1 whose potential is set at a zero volt. Note that a reference character VDDL is a power supply terminal of each of the remaining logic elements of the first and second A/D converting modules 16 and 26.

Figure 4:
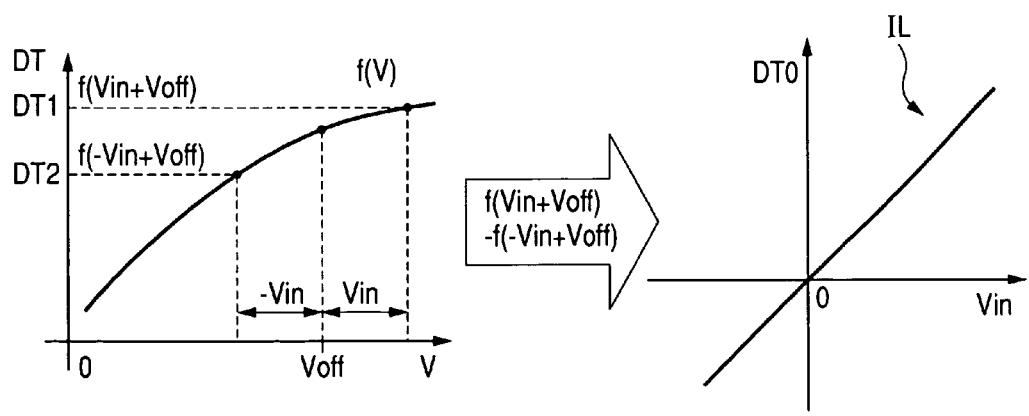
FIG. 4 is a view schematically illustrating graphs that represent an A/D conversion characteristic of each of the first and second A/D converting modules and a substantially ideal linear A/D conversion characteristic obtained by the A/D converter according to the first embodiment.

In the A/D converter 1 according to the first embodiment, as illustrated in FIG. 4, an A/ID conversion characteristic (input/output characteristic) of each of the first and second A/D converting modules 16 and 26 has a nonlinear curve, such as a convex-upward parabola.

Even if the A/D conversion characteristic of each of the first and second A/D converting modules 16 and 26 has a nonlinear curve, adjustment of the offset voltage Voffset in level allows the A/D conversion data DT0 to be definitely obtained by the subtractor 6, which is represented by "DT1−DT2", to be proportional to the analog input voltage Vin (see FIG. 4).

The reason why the definite A/D conversion result of the A/D converter 1 is proportional to the analog input voltage Vin will be described as follows:

That is, when an approximation error is permitted, a nonlinear A/D conversion characteristic of each of the first and second A/D converting modules 16 and 26 can be approximated by a quadratic function within total positive input voltage range.

Specifically, an A/D conversion result DT of each of the first and second A/D conversion units 16 and 26 for an analog input voltage V can be given by the following equation [1]:

$$DT = f(V) = a \cdot V^2 + b \cdot V + c \quad [1]$$

where a, b, and c are constant integers (see FIG. 4).

Assuming that an analog input voltage for a target of A/D conversion is represented by "Vin", and the offset voltage is represented by "Voff", an A/D conversion result DT1 of the first voltage V1 equivalent to the voltage "Voff+Vin" and an A/D conversion result DT2 of the second voltage V2 equivalent to the voltage "Voff−Vin" are respectively represented by the following equations [2] and [3]:

$$DT1 = f(V1) \quad [2]$$
$$= a \cdot (Voff + Vin)^2 + b \cdot (Voff + Vin) + c$$

$$DT2 = f(V2) \quad [3]$$
$$= a \cdot (Voff - Vin)^2 + b \cdot (Voff - Vin) + c$$

In the first embodiment, because the difference between the A/D conversion result DT1 and the A/D conversion result DT2 is obtained as a definitive A/D conversion result of the A/D converter 1, the definitive A/D conversion result, represented by "DT0", is expressed by the following equation [4]:

$$DT0 = f(V1) - f(V2) \quad [4]$$
$$= 2(2 \cdot Voff + b) \cdot Vin$$

The equation [4] includes no second-order term.

Thus, the equation [4] makes it clear that subtraction of the A/D conversion result DT2 of the second voltage "Voff−Vin" from the A/D conversion result DT1 of the first voltage "Voff+Vin" allows the A/D conversion characteristic of the A/D converter 1 to have a substantially ideal linear behavior IL proportional to the analog input voltage Vin.

That is, the ideal linear A/D conversion characteristic IL of the A/D converter 1 allows the A/D conversion data DT0 to be definitely obtained by the subtractor 6 to be proportional to the analog input voltage Vin (see FIG. 4).

As described above, the A/D converter 1 according to the first embodiment can obtain an ideal linear input/output characteristic without the need of deriving conversion expressions for converting the nonlinear A/D conversion curve of each of the first and second A/D converting modules 16 and 26. This makes it possible to provide A/D converters 1 capable of easily obtaining desired A/D conversion results at low cost.

Note that, as described above, in the first embodiment, when an approximation error is permitted, the nonlinear A/D conversion characteristic of each of the first and second A/D converting modules 16 and 26 can be approximated by a quadratic function within total positive input voltage range.

When an approximation error is considered, therefore, the nonlinear A/D conversion characteristic of each of the first and second A/D converting modules 16 and 26 can be approximated by a quadratic function within a certain definite range of positive input voltage.

The certain definite range of positive input voltage is preferably determined so that:

an approximation error caused when approximating the nonlinear A/D characteristic of each of the first and second A/D converting modules 16 and 26 by a quadratic function is smaller than that caused when approximating the nonlinear A/D characteristic of each of the first and second A/D converting modules 16 and 26 by a linear function.

When the certain definite range of positive input voltage is determined, the offset voltage Voff is set preferably within the certain definite range of positive input voltage. In other words, the dynamic range of the A/D converter 1, which means a positive input voltage range that the A/D converter 1 can measure, is preferably set within the certain definite range of positive input voltage. More preferably, when the certain definite range of positive input voltage is determined, the offset voltage Voff is set preferably to the center value of the certain definite range of positive input voltage.

Figure 5:
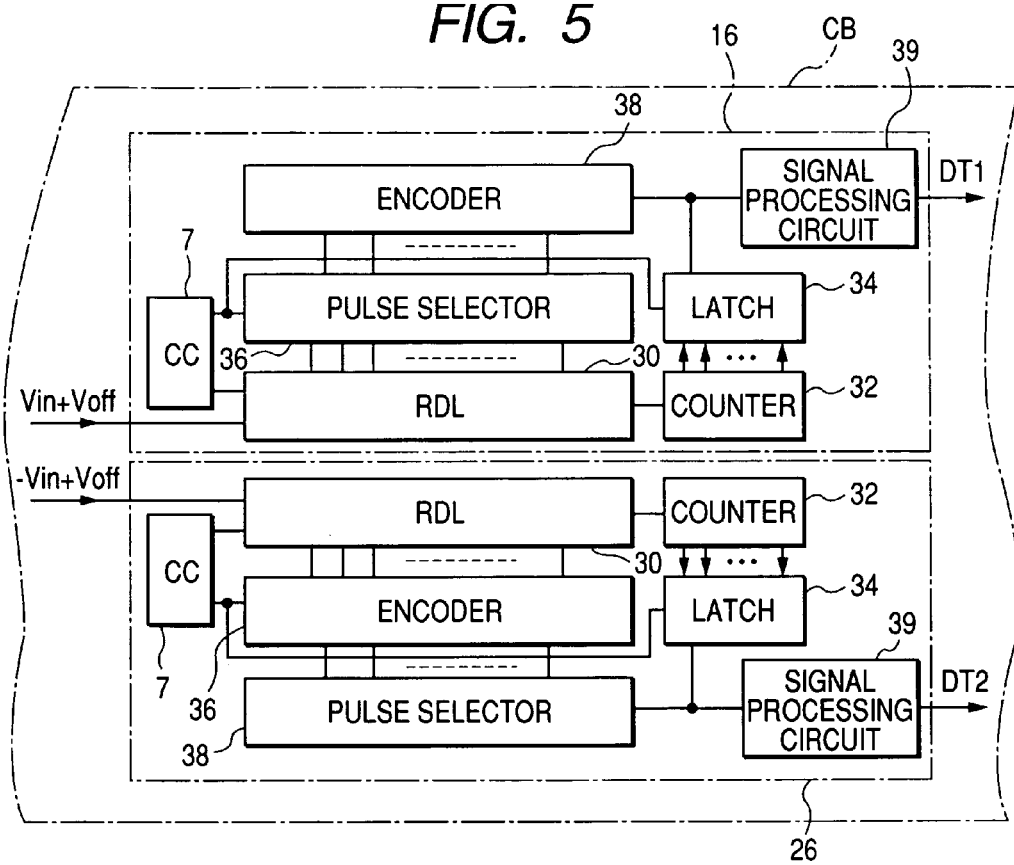
FIG. 5 is a block diagram schematically illustrating an arrangement of logic elements of the first A/D converting module and that of logic elements of the second A/D converting module according to the first embodiment.

The A/D converter 1 is configured such that the first and second A/D converting modules 16 and 26 simultaneously operate to convert the analog input voltage Vin according to the first embodiment. In this case, if the nonlinear A/D conversion characteristic curve of the A/D converting module 16 and that of the A/D converting module 26 have a gap therebetween, the A/D conversion characteristic of the finally obtained A/D conversion data DTO may be different from an ideal linear behavior, For avoiding the difference occurrence, the first A/D converting module 16 and the second A/D converting module 26 have not only the same configuration, but also, as illustrated in FIG. 5, the pulse delay circuit 30 of the first A/D converting module 16 and that of the second A/D converting module 26 are preferably arranged to be close to each other on the circuit board CB. This is because the operation of the pulse delay circuit 30 has much effect on the A/D conversion characteristic of the A/D conversion characteristic of each of the first and second A/D converting modules 16 and 26.

In addition, for the same reason, as illustrated in FIG. 5, other logic components, such as the pulse selector 36, the encoders 38, and so on, of the first A/D converting module 16 and those of the second A/D converting module 26 are preferably arranged to be substantially asymmetric on the circuit board CB.

Specifically, the arrangement of the first and second A/D converting modules 16 and 26 can reduce the variations in the delay times between the delay units (NAND and INVa1 to INVan) of the first A/D converting module 16 and those of the second A/D converting module 26; these variations may cause the gap between the A/D conversion characteristic of the finally obtained A/D conversion data DTO and an ideal linear behavior. This can minimize the distinction between the A/D conversion characteristic curves of the first and second A/D converting modules 16 and 26.

Accordingly, it is possible to reduce the gap between the A/D conversion characteristic of the finally obtained A/D conversion data DTO and an ideal linear behavior; this gap may be caused by the variations in the A/D conversion characteristics of the first and second A/D converting modules 16 and 26. This allows the linearity of the A/D conversion characteristic of the finally obtained A/D conversion data DT0 to be ensured.

Note that, in order to reduce the variations in the input/output characteristics of the first and second A/D converting modules 16 and 26, the voltage levels of the offset voltages Voff to be applied to the first and second A/D converting modules 16 and 26 can be different from each other. In this case, a voltage adjustment circuit 29 can be mounted at the offset-voltage input path of at least one of the first and second adders 14 and 24.

Specifically, the voltage adjustment circuit 29 is operative to adjust the voltage level of the offset voltage Voff to be applied to at least one of the first and second adders 14 and 24. This permits reduction of the variations in the input/output characteristics of the first and second A/D converting modules 16 and 26, making it possible to improve the A/D conversion accuracy of the A/D converter 1.

Figure 6:
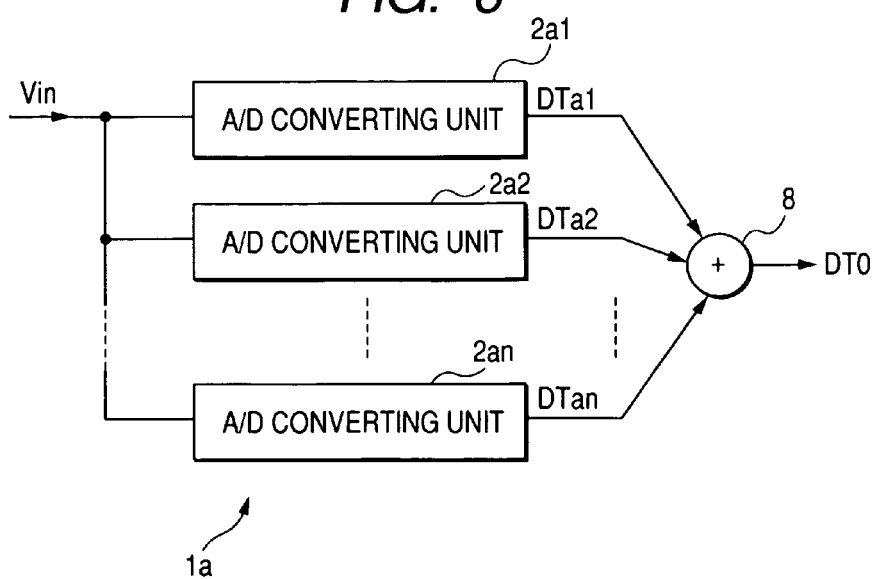
FIG. 6 is a block diagram schematically illustrating an example of the overall structure of an A/D converting system according to a first modification of the first embodiment.

Note that, in order to increase the A/D conversion resolution according to the first embodiment, as illustrated in FIG. 6, an A/D converter 1a as a first modification of the first embodiment is composed of a plurality of A/D converting units 2a1, 2a2, . . . , 2an (n is an integer equal to and more than 2). Each of the A/D converting units 2a1, 2a2, . . . , 2an is structurally and operatively equivalent to the A/D converter 1.

The analog input voltage Vin is configured to be input to each of the A/D converting units 2a1 to 2an such that the A/D converting units 2a1 to 2an simultaneously execute the A/D converting process set forth above, thereby respectively outputting items Da1 to Dan of A/D conversion data of the analog input voltage Vin.

The A/D converter 1a is also composed of an adder 8 to which the items Da1 to Dan of A/D conversion data are input. The adder 8 is operative to calculate the sum of the items Da1 to Dan of A/D conversion data, thereby outputting A/D converting data DT0 as finally obtained A/D conversion result of the A/D converter 1a.

As described above, in the first modification, as compared with the case of converting the analog input voltage Vin into digital data with the use of the single A/D converter 1, it is possible to increase the number of bits of the A/D conversion data DT0 to be finally obtained. This allows the resolution of the A/D conversion data DT0 to more increase.

Figure 7:
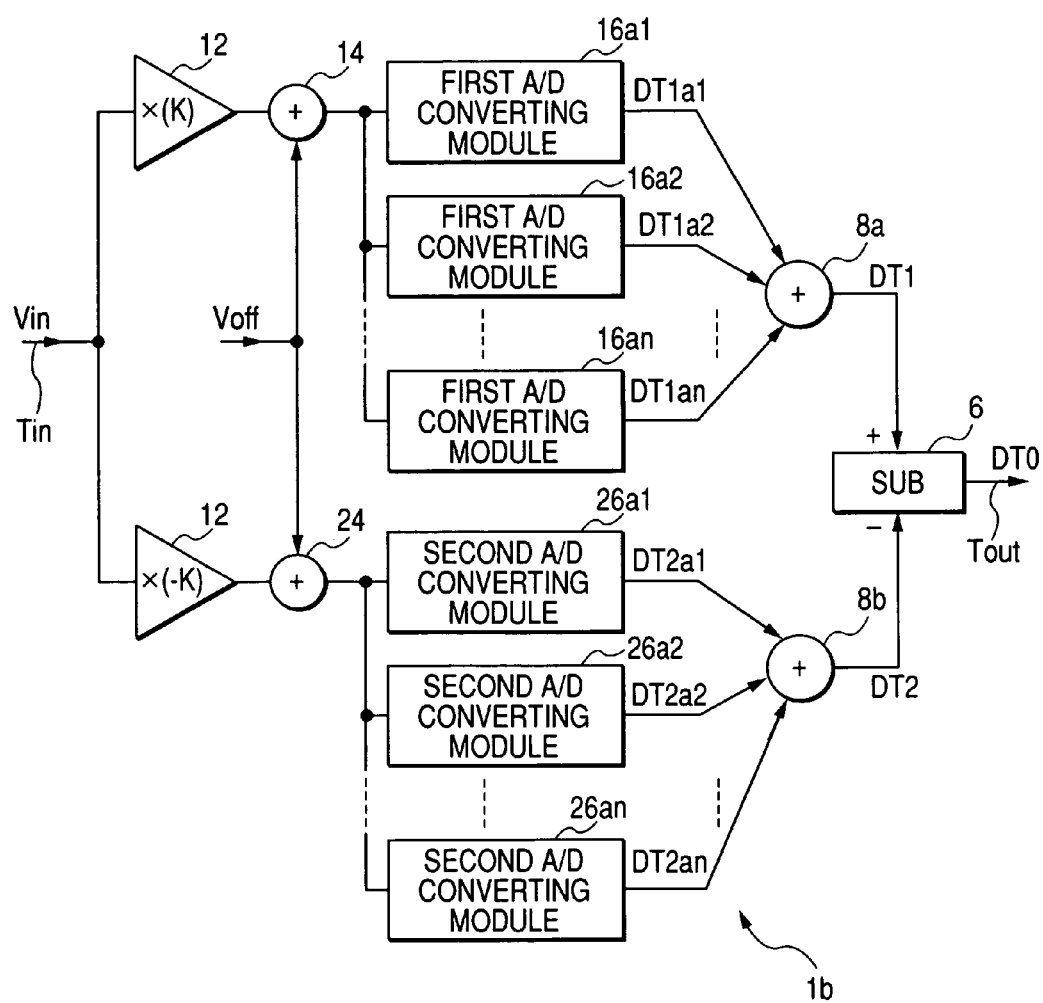
FIG. 7 is a circuit diagram schematically illustrating an example of the overall structure of an A/D converter according to a second modification of the first embodiment.
Figure 8:
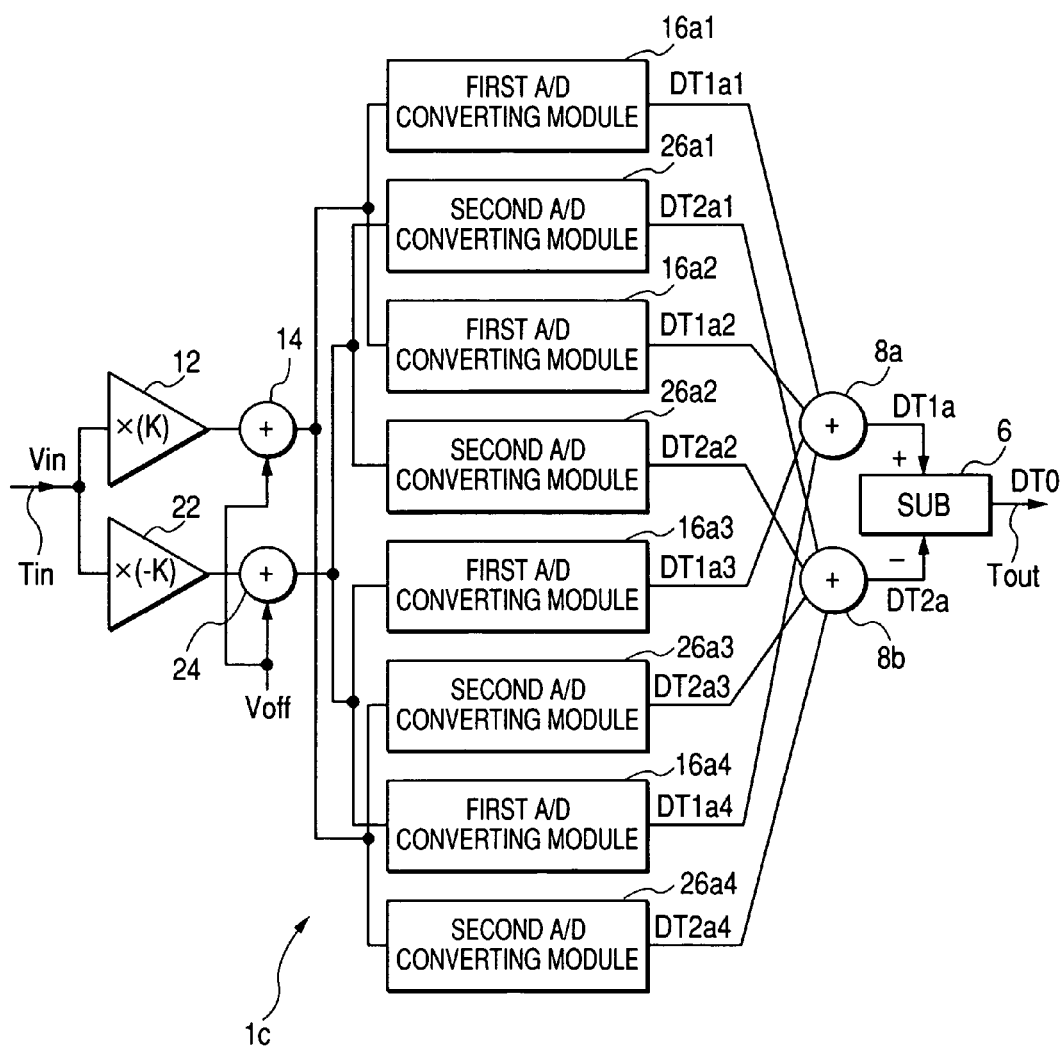
FIG. 8 is a circuit diagram schematically illustrating an example of the overall structure of an A/D converter according to a third modification of the first embodiment.

As second and third modifications of the first embodiment for improving the resolution of the A/D conversion resolution, as illustrated in FIGS. 7 and 8, each of A/D converter 1b and 1c is composed of:

a plurality of first A/D converting modules 16a1, 16a, . . . , 16an (n is an integer equal to and more than 2) each is structurally and operatively equivalent to the first A/D converting module 16; and a plurality of second A/D converting modules 26a1, 26a2, 26an each is structurally and operatively equivalent to the second A/D converting module 26.

As in the case of the first embodiment, the first voltage (Voff+Vin) generated by the first adder 14 is configured to be input to each of the first A/D converting modules 16a1 to 16an such that the first A/D converting modules 16a1 to 16an simultaneously execute the A/D converting process set forth above. This permits the first A/D converting modules 16a1 to 16an to respectively output items D1a1 to D1an of digital data.

Similarly, the second voltage (Voff−Vin) generated by the second adder 24 is configured to be input to each of the second A/D converting modules 26a1 to 26an such that the second A/D converting modules 26a1 to 26an simultaneously execute the A/D converting process set forth above. This permits the second A/D converting modules 26a1 to 26an to respectively output items D2a1 to D2an of digital data.

Each of the A/D converters 1b and 1c is also composed of a first adder 8a to which the items D1a1 to D1an of digital data are input The first adder 8a is operative to calculate the sum of the items D1a1 to D1an of digital data, thereby outputting first digital data DT1a to be input to the subtractor 6. This allows the number of bits of the first digital data DT1a to increase as compared with the number of bits of the first digital data DT1 of the first embodiment.

Similarly, each of the A/D converters 1b and 1c is composed of a second adder 8b to which the items D2a1 to D2an of digital data are input. The second adder 8b is operative to calculate the sum of the items D2a1 to D2an of digital data, thereby outputting second digital data DT2a to be input to the subtractor 6. This allows the number of bits of the second digital data DT2a to increase as compared with the number of bits of the second digital data DT2 of the first embodiment.

As described above, in the second and third modifications of the first embodiment, as compared with the case of converting the analog input voltage Vin into digital data with the use of the A/D converter 1, it is possible to increase the number of bits of the A/D conversion data DT0 to be finally obtained. This allows the resolution of the A/D conversion data DT0 to be more improved.

The configuration of each of the A/D converters 1b and 1c can cut out the need of providing a plurality of first amplifiers 12, a plurality of first adder 14, a plurality of second amplifiers 22, and a plurality of second adder 24. This permits the configuration of each of the A/D converters 1b and 1c to be simple as compared with the configuration of the A/D converter 1a illustrated in FIG. 6. This makes it possible to provide each of the A/D converters 1b and 1c capable of easily obtaining the A/D conversion data DT0 with high resolution at low cost.

Note that, the difference point between the configuration of the A/D converter 1b illustrated in FIG. 7 and that of the A/D converter 1c illustrated in FIG. 8 is described as follows:

The group of first A/D converting modules 16a1 to 16an and that of second A/D converting modules 26a1 to 26an are separately arranged on the circuit board.

In contrast, a first pair of the first and second A/D converting modules 16a1 and 26a1, a second pair of the first and second A/D converting modules 16a2 and 26a2, ..., a n-th pair of the first and second A/D converting modules 16an and 26an are continuously arranged to be adjacent to each other on the circuit board.

Specifically, the first to n-th pairs of the first and second A/D converting modules are arranged on the circuit board in a pectinate configuration.

These arrangements of the first A/D converting modules 16a1 to 16an and the second A/D converting modules 26a1 to 26an illustrated in FIGS. 7 and 8 are designated to reduce the variations in the A/D conversion characteristics of the first and second A/D converting modules 16a1 to 16an and 26a1 to 26an.

Thus, at the time of design, one of the arrangements of the first A/D converting modules 16a1 to 16an and the second A/D converting modules 26a1 to 26an illustrated in FIGS. 7 and 8 can be accordingly selected in consideration of the variations in the A/D conversion characteristics of the first and second A/D converting modules 16a1 to 16an and 26a1 to 26an.

Second Embodiment

Figure 9A:
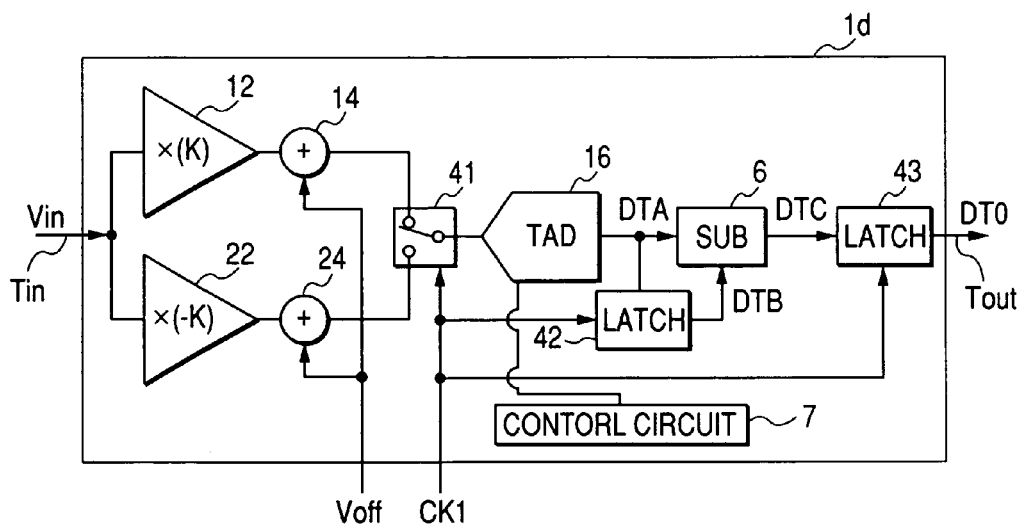
FIG. 9A is a circuit diagram schematically illustrating an example of the overall structure of an A/D converter according to a second embodiment to which the present invention is applied.

FIG. 9A illustrates an example of the overall structure of an A/D converter 1d according to a second embodiment to which the present invention is applied.

As illustrated in FIG. 9A, the A/D converter 1d is composed of a switch 41 in place of the second A/D converting module 26. Output terminals of the first and second adders 14 and 24 are electrically connected to input terminals of the switch 41, and an output terminal of the switch 41 is electrically connected to an input terminal of the first A/D converting module 16. An output terminal of the first A/D converting module 16 is electrically connected to an input terminal of the subtractor 6.

The first voltage (Voff+Vin) generated by the first adder 14 is configured to be input to the switch 41, and the second voltage (Voff−Vin) generated by the second adder 24 is configured to be input to the switch 41. The switch 41 is configured to select one of the first and second voltages (Voff+Vin) and (Voff−Vin) to be input to the first A/D converting module 16.

The switch 41 operates on a clock signal CK1 consisting of a repetitive series of fixed width pulses (clock pulses) having a fixed repetition frequency, which is generated by, for example, the control circuit 7. A clock signal generator can generate the clock signal CK1.

Specifically, the switch 41 works to:

select the second voltage (Voff−Vin) to send it to the first A/D converting module 16 when the clock signal CK1 is high; and select the first voltage (Voff+Vin) to send it to the first A/D converting module 16 when the clock signal CK1 is low.

Figure 9B:
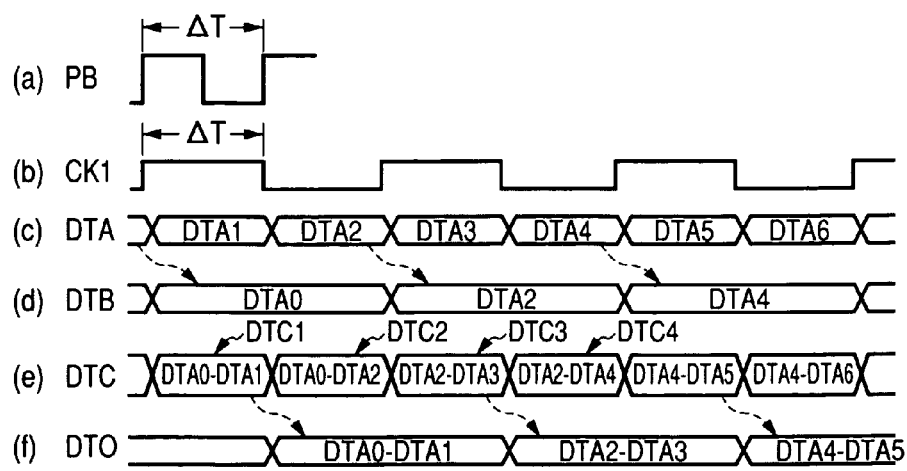
FIG. 9B is a time chart of operations to be executed by the A/D converter illustrated in FIG. 9A.

The repetition cycle of the clock signal CK1 is set to be double of the pulse repetition cycle ΔT of the pulse signal PB on which the first A/D converting module 16 executes the A/D converting operation (see (a) and (b) in FIG. 9B).

Specifically, the switch 41 is operative to switch an input voltage to be sent to the first A/D converting module 16 in synchronization with the A/D converting operation of the first A/D converting module 16.

In addition, the A/D converter 1d is composed of a latch 42 electrically connected to the subtractor 6 and the output terminal of the first A/D converting module 16. The clock signal CK1 is input to the latch 42.

The latch 42 is operative to latch digital data output from the first A/D converting module 16 at each riding timing of the clock signal CK1. In other words, the latch 42 is operative to latch the digital data output from the first A/D converting module 16 at the rate of one latch every two A/D converting operations of the first A/D converting module.

For example, as illustrated by (c) and (d) in FIG. 9B, when the first A/D converting module 16 outputs items DTA0, DTA1, DTA2, DTA3, ..., of digital data DTA in synchronization with the rising timings of the pulse signal PB, the latch 42 latches the items DTA0, DTA2, DTA4, ..., of digital data DTA in synchronization with the riding timings of the clock signal CK1. The latched items DTA0, DTA2, DTA4, ... corresponding to the first voltage (Voff+Vin) will be referred to as first digital data DTB, and the remaining items DTA1, DTA3, ..., of digital data corresponding to the second voltage (Voff−Vin) will be referred to as second digital data.

The subtractor 6 is operative to calculate, as digital data DTC, the difference between the latched first digital data DTB (DTA0, DTA2, DTA4, ...) and the digital data DTA (DTA1, DTA2, DTA3, ...) output from the first A/D converting module 16 in synchronization with the riding timings of the pulse signal PB.

Specifically, as illustrated by (e) in FIG. 9B, as the digital data DTC, data items DTC1 (DTA0−DTA1), DTC2 (DTA0−DTA2), DTC3 (DTA2−DTA3), DTC4 (DTA2−DTA4), ... are obtained.

As described above, the digital data DTC consists of:

first items (DTA0−DTA1, DTA2−DTA3, DTA4−DTA5, ...) corresponding to voltages obtained by subtracting the second voltages from the first voltages respectively one cycle ΔT before the second voltages; and second items PTA0−DTA2, DTA2−DTA4, DTA4−DTA6, ...) corresponding to voltages obtained by subtracting, from the first voltages calculated one cycle ΔT before some of the A/D converting operations of the first A/D converting module 16 in synchronization with the rising timings of the clock signal CK1, the first voltages calculated one cycle ΔT after some of the A/D converting operations of the first A/D converting module 16 in synchronization with the rising timings of the clock signal CK1.

Specifically, the digital data DTC chronologically changes alternately between one of the first items PTA0−DTA1, DTA2−DTA3, DTA4−DTAS, ...) and one of the second items (DTA0−DTA2, DTA2−DTA4, DTA4−DTA6, ...) in synchronization with every rising timing of the pulse signal PB.

For this reason, the A/D converter 1d is composed of a latch 43 electrically to an output terminal of the subtractor 6. The clock signal CK1 is input to the latch 43.

The latch 43 is operative to selectively output the first items PTA0−DTA1, DTA2−DTA3, DTA4−DTA5, ...) in the items of the digital data DTC output from the subtractor 6.

Specifically, the latch 43, as illustrated by (f in FIG. 9I, latches the output DTC from the subtractor 6 in synchronization with the falling timings of the clock signal CK1.

Therefore, the latch 43 selectively outputs, as A/D conversion data DT0 corresponding to A/D conversion result of the analog input voltage Vin, the first items (DTA0–DTA1, DTA2–DTA3, DTA4–DTA5, . . . ) corresponding to voltages obtained by subtracting the second voltages from the first voltages respectively one cycle ΔT before the second voltages.

As described above, the A/D converter 1d according to the second embodiment slows down the A/D conversion process as compared with the A/D converter 1 with the first and second A/D converting modules 16 and 26 for simultaneously executing the A/D conversion processes for the first and second voltages. In other words, the A/D converter 1 according to the first embodiment makes it possible to simultaneously executing the A/D converting processes for the first and second voltages, thereby enhancing the speed of the A/D conversion of the A/D converter 1 as compared with the A/D converter 1d.

However, the A/D converter 1d according to the second embodiment can reduce the number of the A/D converting modules as compared with the A/D converter 1 to simplify the structure of the A/D converter 1d. This makes it possible to reduce the cost of manufacturing the A/D converter 1d.

As set forth above, the A/D converter 1d illustrated in FIG. 9A is configured to update the A/D conversion data DT0 in synchronization with the falling timings of the clock signal CK1. In other words, the A/D converter 1d illustrated in FIG. 9A is configured to update the A/D conversion data DT0 at the rate of one update every two A/D converting operations of the first A/D converting module 16 (see (f) in FIG. 9B).

Figure 10A:
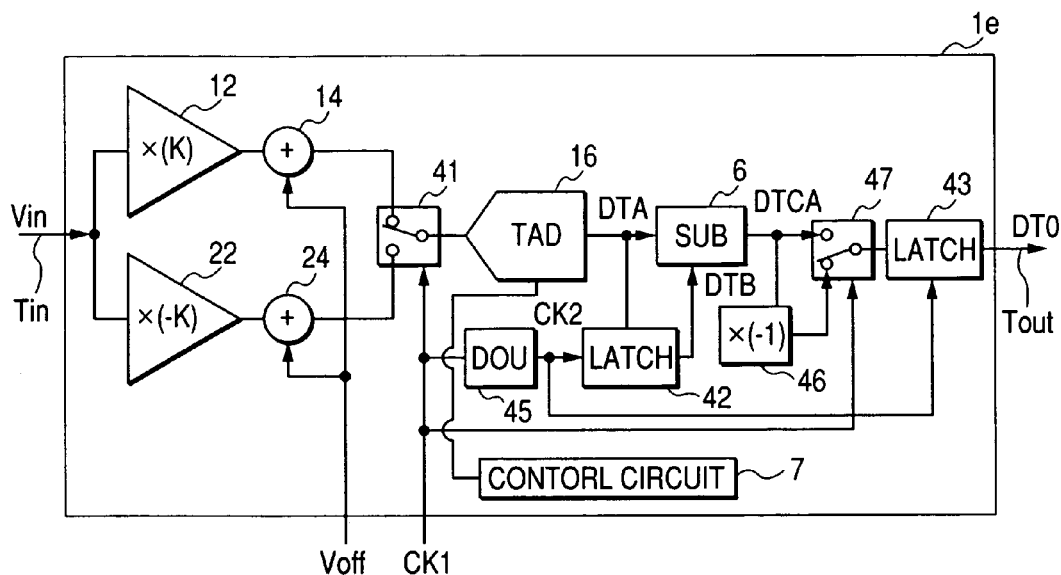
FIG. 10A is a circuit diagram schematically illustrating an example of the overall structure of an A/D converter according to a modification of the second embodiment.

As a modification of the A/D converter 1d, an A/D converter 1e illustrated in FIG. 10A is configured to update the A/D conversion data DT0 in synchronization with the A/D conversion cycle of the first A/D converting module 16. In other words, the A/D converter 1e illustrated in FIG. 10A is configured to update the A/D conversion data DT0 at the rate of one update every A/D converting operation of the first A/D converting module 16.

Specifically, in addition to the structure of the A/D converter 1d, as illustrated in FIG. 10A, the A/D converter 1e is composed of a frequency doubler (DOU) 45 electrically connected to the latch 42. The clock signal CK1 is input to the frequency doubler 45.

Figure 10B:
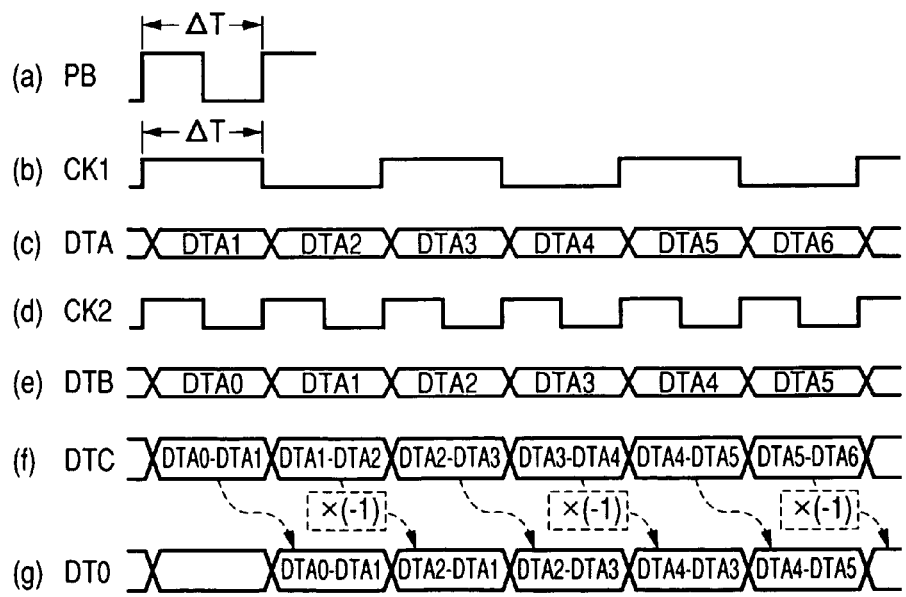
FIG. 10B is a time chart of operations to be executed by the A/D converter illustrated in FIG. 10A.

The frequency doubler 45 is operative to double the frequency of the clock signal CK1 to generate a clock signal CK2 whose frequency is double of the frequency of the clock signal CK1 (see (d) in FIG. 10B).

The A/D converter 1e is also composed of a multiplier 46 electrically connected to the output terminal of the subtractor 6. The multiplier 46 is configured to multiply digital data DTCA output from the subtractor 6 by "−1" to reverse the sign of the digital data DTCA.

The A/D converter 1e is composed of a switch 47 electrically connected to the output terminal of the subtractor 6 and to an input terminal of the latch 43. The switch 47 is configured to selectively send any one of the output of the multiplier 46 and that of the subtractor 6. In place of the clock signal CK1, the clock signal CK2 is input to the latch 43.

The latches 42 and 43 operate in synchronization with the rising timings of the second clock signal CK2. The switch 47 is operative to select the output of the multiplier 46 when the clock signal CK1 is low, and to select the output of the subtractor 6 when the clock signal CK1 is high.

In the A/D converter 1e, as illustrated by (c) in FIG. 10B, the digital data DTA (DTA0, DTA1, DTA2, DTA3, . . . ) output from the first A/D converting module 16 are sequentially latched by the latch 42 in synchronization with the rising timings of the clock signal CK2. The latched items DTA0, DTA1, DTA2, DTA3, . . . will be referred to as digital data DTB1 (see (e) in FIG. 10B).

New items of the digital data DTA sequentially obtained by the first A/D converting module 16 are sequentially subtracted by the subtractor 6 from the previous items of the digital data DTB latched by the latch 42, so that items of digital data DTCT are sequentially output from the subtractor 6.

As described above, the digital data DTCT consists of:

first items (DTA0–DTA1, DTA2–DTA3, DTA4–DTA5, . . . ) corresponding to voltages obtained by subtracting the second voltages from the first voltages respectively one cycle ΔT before the second voltages; and second items (DTA1–DTA2, DTA3–DTA4, DTA5–DTA6, . . . ) corresponding to voltages obtained by subtracting the first voltages from the second voltages respectively one cycle ΔT after the first voltages.

Specifically, the digital data DTCT chronologically changes alternately between one of the first items (DTA0–DTA1, DTA2–DTA3, DTA4–DTA5, . . . ) and one of the second items (DTA1–DTA2, DTA3–DTA4, DTAS–DTA6, . . . ) in synchronization with every rising timing of the clock signal CK2.

As illustrated in FIG. 10B, because the signs of the second items DTA1–DTA2, DTA3–DTA4, DTA5–DTA6, . . . ) are reversed by the multiplier 46 to be selected by the switch 47, items (DTA0–DTA1, DTA2–DTA1, DTA2–DTA3, DTA4–DTA3, DTA4–DTA5, . . . ) of digital data corresponding to voltages obtained by subtracting the second voltages from the first voltages are sequentially latched by the latch 43 in synchronization with the rising timings of the clock signal CK2 (see (g) in FIG. 10B).

The items (DTA0–DTA1, DTA2–DTA1, DTA2–DTA3, DTA4–DTA3, DTA4–DTAS, . . . ) of digital data are therefore output from the latch 43 as A/D conversion data DT0 corresponding to A/D conversion result of the analog input voltage Vin.

As described above, as evidenced by comparison between (f) in FIG. 9A and (g) in FIG. 10A, the A/D converter 1e according to the second embodiment makes it possible to update the A/D conversion data DT0 at the rate of one update every A/D converting operation of the first A/D converting module 16. This allows the A/D conversion data update rate of the A/D converter 1d to be faster than that of the A/D converter 1d. Thus, the A/D converter 1e is more useful if the analog input voltage Vin fluctuates.

Note that, in the A/D converters 1d and 1e respectively illustrated in FIGS. 9A and 10A, the switching cycle ΔT, which is double of the cycle of A/D conversion of the first A/D converting module 16, of each of the switches 41 and 47 is preferably set substantially to equal to or more than one quarter of the cycle of fluctuation of the analog input voltage Vin as A/D conversion target on the basis of the sampling theorem. This is because:

the sampling theorem means that the cycle to be used by A/D conversion need be equal to or lower than the half of the cycle of fluctuation of the analog input voltage Vin as A/D conversion target; and the time required to obtain the definite A/D conversion data DT0 is substantially double of the time required for the first A/D converting module 16 to execute the A/D converting operation.

Third Embodiment

Figure 11:
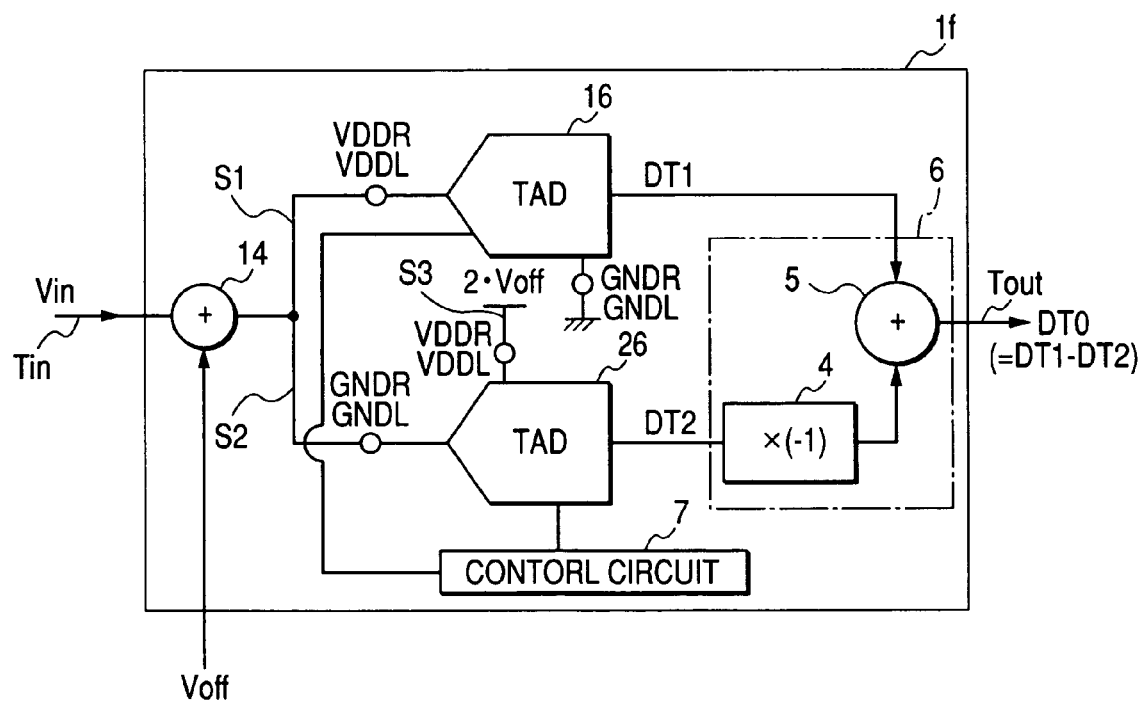
FIG. 11 is a circuit diagram schematically illustrating an example of the overall structure of an A/D converter according to a third embodiment to which the present invention is applied.

FIG. 11 illustrates an example of the overall structure of an A/D converter 1f according to a third embodiment to which the present invention is applied.

As illustrated in FIG. 11, the A/D converter 1f has a structure substantially identical to that of the A/D converter 1 illustrated in FIG. 1 except that the first and second amplifiers 11 and 22 and the second adder 24 are omitted.

Specifically, an input terminal Tin of the A/D converter 1f is electrically connected to an input terminal of a first adder 14, and an output terminal of the first adder 14 is electrically connected to respective input terminals of the first and second A/D converting modules 16 and 26.

Specifically, upon input of the analog input voltage Vin into the A/D converter 1f through its input terminal Tin, the analog input voltage Vin is input to the first adder 14. By the first adder 14, an adjustable offset voltage Voff whose voltage level is "Voff" is added to the analog input voltage Vin so that a first voltage "Voff+Vin" is generated.

The first voltage "Voff+Vin" is separated to be fed respectively to the first and second A/D converting modules 16 and 26.

In the first A/D converting module 16 of the A/D converter 1f, the first voltage "Voff+Vin" is configured to be input to:

the power supply terminal VDDR of the pulse delay circuit 30 through a first signal path S1; and the power supply terminal VDDL of the logic elements except for the pulse delay circuit 30 through the first signal path S1.

Moreover, in the first A/D converter 16 of the A/D converter 1e, the ground terminal GNDR of the pulse delay circuit 30 of the first A/D converting module 16 is connected, together with the ground terminal GNDL of each of the remaining logic elements of the first converting module 16, to the ground of the A/D converter 1f whose potential is set at a zero volt.

This allows the first voltage (Voff+Vin) to be applied to the delay units of the pulse delay circuit 30 and the remaining logic elements of the first A/D converting module 16.

In the second A/D converting module 26 of the A/D converter 1f, the first voltage "Voff+Vin" is configured to be input to:

the ground terminal GNDR of the pulse delay circuit 30 through a second signal path S2; and the ground terminal GNDL of the logic elements except for the pulse delay circuit 30 through the second signal path S2.

Moreover, in the second A/D converter 26 of the A/D converter 1f, a voltage 2·Voff whose level is doubler than the level "Voff" of the offset voltage Voff is configured to be input to:

the power supply terminal VDDR of the pulse delay circuit 30 through a third signal path S3; and the power supply terminal VDDL of the logic elements except for the pulse delay circuit 30 through the third signal path S3.

For example, the control circuit 7 can generate the voltage "2·Voff" and apply it to the power supply terminals VDDR and VDDL through the third signal path S3. Moreover, an voltage regulator or the like can be provided for generating the voltage "2·Voff" and applying it to the power supply terminals VDDR and VDDL through the third signal path S3.

This allows a voltage obtained by subtracting the first voltage "Vin+Voff" from the voltage "2·Voff to be applied to the delay units of the pulse delay circuit 30 and the remaining logic elements of the second A/D converting module 26; this voltage obtained by the subtraction has the level of "2·Voff−(Vin+Voff)", which is equal to the level of "Voff−Vin" corresponding to the second voltage set forth above.

Accordingly, operations of the first and second A/D converting modules 16 and 26, and the subtractor 6, which has been described in the first embodiment, allow the A/D conversion characteristic of the A/D converter 1f to have an ideal linear behavior proportional to the analog input voltage Vin (see FIG. 4). This makes it possible to obtain effects similar to those obtained by the A/D converter 1 according to the first embodiment.

In addition, the A/D converter 1f according to the third embodiment is so configured as to omit the first and second amplifiers 12 and 22 and the second adder 24, which are operative to generate the second voltage. This allows the structure of the A/D converter 1e to be simplified, making it possible to reduce the cost of manufacturing the A/D converter 1f.

As with the A/D converter 1, the A/D converter if according to the third embodiment can be configured such that all logic elements of the first A/D converting module 16 and those of the second A/ID converting module 26 are arranged to be substantially axisymmetric on the circuit board CB (see FIG. 5).

In addition, as in the case of the A/D converter 1, a voltage adjustment circuit 29 can be mounted at the offset-voltage input path of at least one of the first and second adders 14 and 24, which makes it possible to improve the A/D conversion accuracy of the A/D converter 1f.

As well as the A/D converter 1a, as a first modification of the third embodiment, a plurality of A/D converting units each of which is structurally and operatively equivalent to the A/D converter 1f can constitute an A/D converter operative to calculate the sum of A/D conversion results of the plurality of A/D converting units. The configuration of the A/D converter allows the resolution of the definitely obtained A/D conversion data to more increase.

In addition, as with the first embodiment, an A/D converter according to a second modification of the third embodiment can be composed of:

a plurality of first A/D converting modules each is structurally and operatively equivalent to the first A/D converting module 16; and a plurality of second A/D converting modules each is structurally and operatively equivalent to the second A/D converting module 26.

In the second modification, subtraction of the sum of A/D conversion results of the second A/D converting modules from that of A/D conversion results of the first A/D converting modules permits A/D conversion data to be definitely obtained, which makes it possible to more improve the resolution of the definitely obtained A/D conversion data.

Figure 12A:
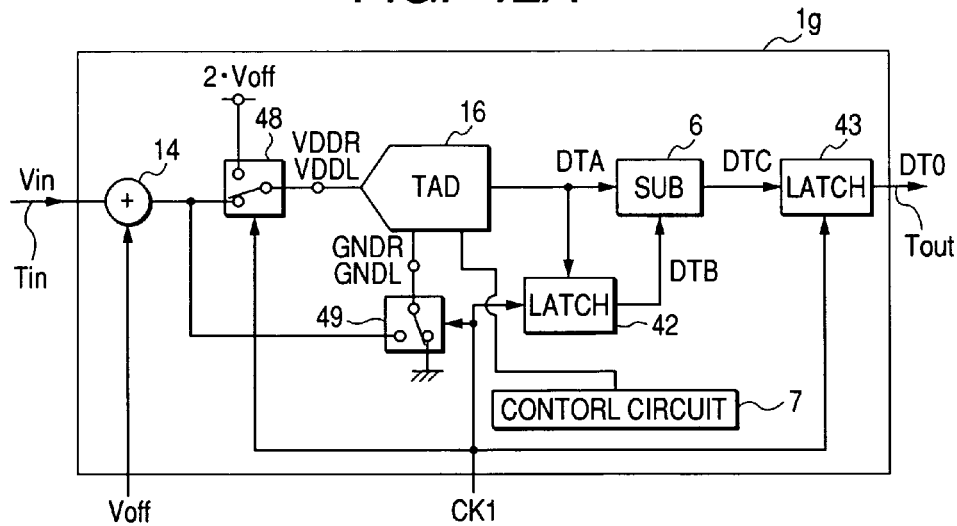
FIG. 12A is a circuit diagram schematically illustrating an example of the overall structure of an A/D converter according to a second modification of the third embodiment to which the present invention is applied.

In addition, as a second modification of the third embodiment, in order to simplify the structure of A/D converter 1f, as illustrated in FIG. 12A, an A/D converter 1g is composed of:

a latch 42 electrically connected to the subtractor 6 and the output terminal of the first A/D converting module 16 such that the clock signal CK1 is input thereto;

a latch 43 electrically to an output terminal of the subtractor 6 such that the clock signal CK1 is input thereto;

a switch 48 electrically connected to an output terminal of the first adder 14 and to an input terminal of the first A/D converting module 16 such that the clock signal CK1 is input thereto; and a switch 49 electrically connected to the output terminal of the first adder 14 and to the ground terminals GNDR and GNDL such that the clock signal CK1 is input thereto.

To the switch 48, a voltage $2^{TM}$Voff whose level is doubler than the level "Voff" of the offset voltage Voff is configured to be applied.

Specifically, the switch 48 is configured to select one of the first voltage (Voff+Vin) and the voltage (2·Voff) to be input to the power supply terminals VDDR and VDDL of the first A/D converting module 16.

In synchronization with the selection of the switch 48, the switch 49 is configured to select one of the zero volt and the first voltage (Voff+Vin) to be input to the ground terminals GNDR and GNDL of the first A/D converting module 16.

Specifically, when the switch 48 selects the first voltage (Voff+Vin) to be input to the power supply terminals VDDR and VDDL of the first A/D converting module 16, in synchronization with the selection of the switch 48, the switch 49 selects the zero volt. This allows the first voltage (Voff+Vin) to be input to the first A/D converting module 16.

On the other hand, when the switch 48 selects the voltage (2·Voff) to be input to the power supply terminals VDDR and VDDL of the first A/D converting module 16, in synchronization with the selection of the switch 48, the switch 49 selects the first voltage (Voff+Vin). This allows a voltage obtained by subtracting the first voltage "Vin+Voff" from the voltage "2·Voff" to be applied to the first A/D converting module 16; this voltage obtained by the subtraction has the level of "2·Voff−(Vin+Voff)", which is equal to the level of "Voff−Vin" corresponding to the second voltage set forth above.

Accordingly the second medication can obtain effects similar to those obtained by the A/D converter 1d according to the second embodiment.

Figure 12B:
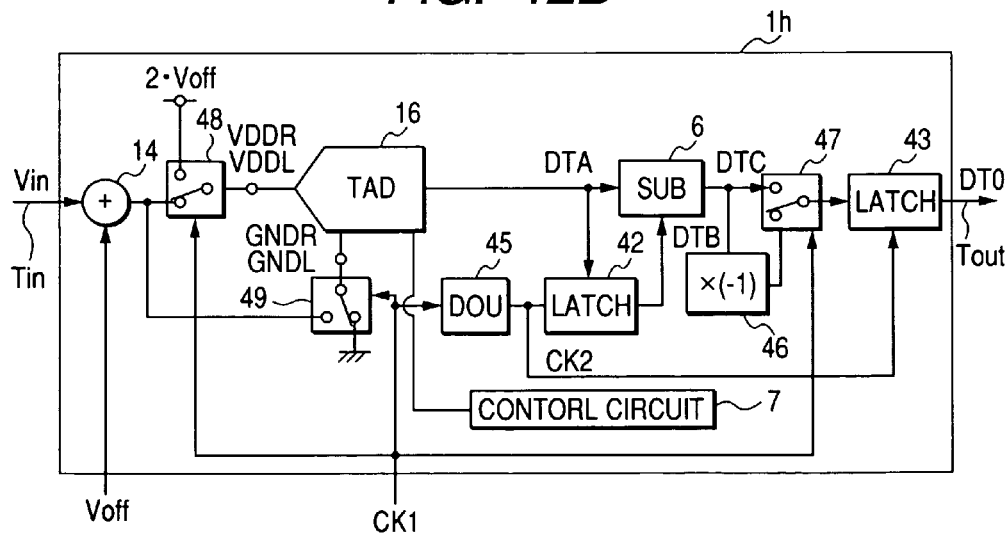
FIG. 12B is a circuit diagram schematically illustrating an example of the overall structure of an A/D converter according to a third modification of the third embodiment to which the present invention is applied.

As in the case of the modification of the second embodiment, in addition to the structure of the A/D converter 1g, as illustrated in FIG. 12B, an A/D converter 1h according to a third modification of the third embodiment to which the present invention is applied is composed of:

a frequency doubler 45 electrically connected to the latch 42 a multiplier 46 electrically connected to the output terminal of the subtractor 6;

a switch 47 electrically connected to the output terminal of the subtractor 6 and to an input terminal of the latch 43.

As well as the modification of the second embodiment, the A/D converter 1h makes it possible to update the A/D conversion data DT0 at the rate of one update every A/D converting operation of the first A/D converting module 16. This allows the A/D conversion data update rate of the A/D converter 1h to be faster than that of the A/D converter g.

Various types of A/D converters to each of which the present invention is applied have been described. Specifically, the various types of A/D converters can cause an input-output characteristic curve to be a substantially ideal linear behavior passing the origin point of the coordinate system representing the input-output characteristic.

If the delay time of each of the delay units of various types of A/D converters sensitively changes depending on temperature change, the linear input-output characteristic, such as its slope, may change depending on the delay-time change.

In order to correct A/D conversion data DTs output from an A/D converter 1 as a representative example of the variations, which is affected by the change of the linear input-output characteristic, an A/D converter 1i is provided with an A/D converting unit 2a that is structurally and operatively equivalent to the A/D converter 1.

Figure 13A:
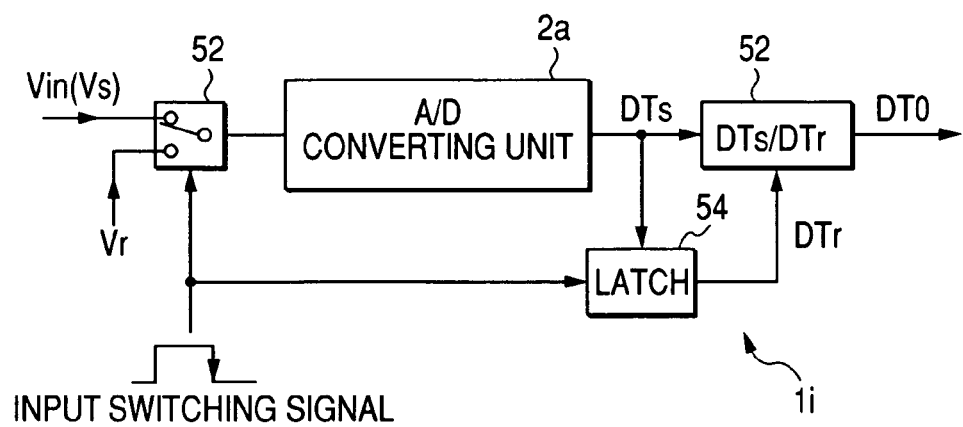
FIG. 13A is a circuit diagram schematically illustrating an example of the overall structure of an A/D converter according to a modification of the first embodiment to which the present invention is applied.

The A/D converter 1i is also provided at a periphery of the A/D converting unit 2a with a temperature-change correcting system CS (see FIG. 13A).

Specifically, the temperature-change correcting system CS is composed of a switch 52 electrically connected to the input terminal of the A/D converting unit 2a. The switch 52 is operative to switch an input to the A/D converting unit 2a through the input terminal Tin between the analog input voltage Vin (Vs) and a reference voltage Vr whose level "Vr" is predetermined beforehand.

The temperature-change correcting system CS is also composed of a latch 54 electrically connected to an output terminal of the A/D converting unit 2a and operative to latch A/D conversion data based on the reference voltage Vr at a reference temperature of T1 output from the A/D converting unit 2a when the reference voltage Vr is selected by the switch 52. The latched A/D conversion data will be referred to as reference A/D conversion data DT{T1(Vr)} hereinafter.

The temperature-change correcting system CS is further composed of a correcting unit 56 electrically connected to the output terminal of the A/D converting unit 2a and to the latch 54.

The correcting unit 56 is operative to:

store reference A/D conversion data DT{T1(r)} when the reference voltage Vr is switched by the switch 52;

divide, by the reference A/D conversion data DT{T2(Vr)} latched by the latch 54 when the reference voltage Vr is switched by the switch 52, A/D conversion data DT{T2(Vs)} based on the analog input voltage Vin at a temperature T2 and multiply, by the stored reference A/D conversion data DT{T1(Vr)}, the quotient DT{2(Vs)}/DT{T2(Vr), thereby correcting A/D conversion data DT{T2(Vs)} depending on the temperature change between the temperature T1 and the temperature T2 to the A/D conversion data DT{T1(Vs)}.

Figure 13B:
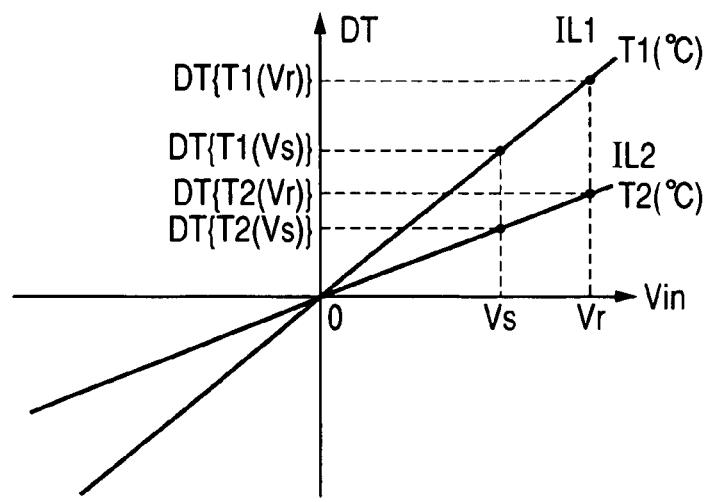
FIG. 13B is a view schematically illustrating a graph that represents linear A/D conversion characteristics of A/D conversion of an A/D converter according to the modification of the first embodiment.

Specifically, as described in FIG. 13B, even if the slope of the A/D conversion characteristic changes due to temperature change (see the line IL1 and the IL2), the changed input-output characteristics of the A/D converter 1 are kept to pass through the origin point and to be ideally proportional to the level of input analog voltage. For this reason, the ratio of the analog input voltage Vs to the reference voltage Vr is constant independently of the change in the slope of the A/D conversion characteristic.

This allows the ratio of A/D conversion data DT{T1(Vs)} based on the analog input voltage Vin at a given reference temperature T1 to A/D conversion data DT{T1(Vr)} based on the reference voltage Vr at the reference temperature T1 to be constant. Similarly, the ratio of A/D conversion data DT{T2(Vs)} based on the analog input voltage Vin at a temperature T2 to A/D conversion data DT{T2(Vr)} based on the reference voltage Vr at the temperature T2 to be also constant.

These descriptions are put into one equation as follows:

$$\frac{Vs}{Vr} = \frac{DT\{T1(Vs)\}}{DT\{T1(Vr)\}} = \frac{DT\{T2(Vs)\}}{DT\{T2(Vr)\}}$$

Accordingly, even if the temperature varies from the reference temperature T1 to T2 so that the A/D conversion data DT{T2(Vs)} obtained depending on the temperature variation, it is possible to correct the A/D conversion data DT{T2(Vs)} by multiplying the DT{T2(Vs)} by the correction coefficient DT{T1(Vr)}/DT{T2(Vr)}. This allows the A/D conversion data DT{T2(Vs) to be obtained independently of the change in the temperature from T1 to T2.

Specifically, in a conventional method using an input-output curve of a conventional A/D converter, at a reference temperature, at least two items of A/D conversion data based on at least two reference voltages are measured by the conventional A/D converter. Thereafter, a line passing the measured items of A/D conversion data is stored as temperature correction data. When an A/D conversion data based on an analog input voltage is obtained by the conventional A/D converter, the A/D conversion data is corrected based on the correction data.

However, the A/D converter 1i can eliminate the need of measuring the at least two items of A/D conversion data based on at least two reference voltages and of obtaining the line (correction data), making it possible to simplify the temperature-change correction.

In the first to third embodiments and their modifications, the A/D converters are operative to execute A/D converting operation for an analog input voltage, but the present invention is not limited to the structure.

Specifically, the A/D converters according to the present invention can execute A/D conversion operation for an analog input signal with a predetermined signal level "Vin". In this case, in the first embodiment and its modifications, as an example, as the adjustable offset voltage Voff, an offset signal whose signal level is "Voff" can be used. Similarly, as the first voltage and the second voltage, a first signal whose signal level is "Voff+Vin" and a second signal whose signal level is "Voff−Vin" can be generated by the first and second adders 14 and 24. Much the same is true on the other embodiments and their modifications.

While there has been described what is at present considered to be the embodiments and their modifications of the present invention, it will be understood that various modifications which are not described yet may be made therein, and it is intended to cover in the appended claims all such modifications as fall within the true spirit and scope of the invention.

What is claimed is:

1. An analog-to-digital conversion method comprising:
   executing analog-to-digital conversion of a first input signal and a second input signal based on an analog-to-digital conversion characteristic curve to generate first digital data and second digital data respectively corresponding to the first input signal and the second input signal, the first input signal having a first level, the first level being the sum of an offset level and a level of a target analog signal for analog-to-digital conversion, the second input signal having a second level, the second level being generated by subtracting the offset level from the level of the target analog signal; and
   obtaining difference digital data between the first digital data and the second digital data to output the obtained difference digital data as digital data of the target analog signal.

2. An analog-to digital conversion method according to claim 1, wherein the executing analog-to-digital conversion of the first input signal includes:
   circulating a pulse signal through a plurality of delay units while the pulse signal is delayed thereby, the plurality of delay units operating based on the first level of the first input signal, a delay time of each of the plurality of delay units depending on the first level of the first input signal; and
   counting a number of delay units through which the pulse signal has passed within a predetermined sampling period to generate the first digital data based on the counted number, and the executing analog-to-digital conversion of the second input signal includes:
   circulating a pulse signal through a plurality of delay units while the pulse signal is delayed thereby, the plurality of delay units operating based on the second level of the second input signal, a delay time of each of the plurality of delay units depending on the second level of the second input signal; and
   counting a number of the delay units through which the pulse signal has passed within a predetermined sampling period to generate the second digital data based on the counted number.

3. An analog-to digital conversion method according to claim 1, further comprising:
   storing, when a reference signal with a predetermined reference level is used as the target analog signal at a reference temperature, the digital data of the reference signal therein at the reference temperature as first reference digital data;
   obtaining, when the reference signal with the predetermined reference level is used as the target analog signal at an arbitrary temperature except for the reference temperature, the digital data of the reference signal therein at the arbitrary temperature as second reference digital data;
   dividing, by the second reference digital data, the digital data of the target analog signal at the arbitrary temperature; and
   multiplying, by the first reference digital data, a quotient of the digital data of the target analog signal at the arbitrary temperature and the second reference digital data to correct the target analog signal at the arbitrary temperature.

4. An analog-to digital conversion method comprising:
   executing analog-to-digital conversion of a first input signal based on an analog-to-digital conversion characteristic curve to generate first digital data, the first input signal having a first level, the first level being the sum of an offset level and a level of a target analog signal for analog-to-digital conversion;
   subtracting the first level of the first input signal from double of the offset level to generate a second input signal;
   executing analog-to-digital conversion of the second input signal based on the analog-to-digital conversion characteristic curve to generate second digital data; and
   obtaining difference digital data between the first digital data and the second digital data to output the obtained difference digital data as digital data of the target analog signal.

5. An analog-to digital conversion method according to claim 4, wherein the executing analog-to-digital conversion of the first input signal includes:
   circulating a pulse signal through a plurality of delay units while the pulse signal is delayed thereby, the plurality of delay units operating based on the first level of the first input signal, a delay time of each of the plurality of delay units depending on the first level of the first input signal; and
   counting a number of the delay units through which the pulse signal has passed within a predetermined sampling period to generate the first digital data based on the counted number, and the executing analog-to-digital conversion of the second input signal includes:
   circulating a pulse signal through a plurality of delay units while the pulse signal is delayed thereby, the plurality of delay units operating based on the second level of the second input signal, a delay time of each of the plurality of delay units depending on the second level of the second input signal; and counting a number of delay units through which the pulse signal has passed within a predetermined sampling period to generate the second digital data based on the counted number.

6. An analog-to digital conversion method according to claim 4, further comprising:

storing, when a reference signal with a predetermined reference level is used as the target analog signal at a reference temperature, the digital data of the reference signal therein at the reference temperature as first reference digital data;

obtaining, when the reference signal with the predetermined reference level is used as the target analog signal at an arbitrary temperature except for the reference temperature, the digital data of the reference signal therein at the arbitrary temperature as second reference digital data;

dividing, by the second reference digital data, the digital data of the target analog signal at the arbitrary temperature; and multiplying, by the first reference digital data, a quotient of the digital data of the target analog signal at the arbitrary temperature and the second reference digital data to correct the target analog signal at the arbitrary temperature.

7. An analog-to-digital converter comprising:

a generating unit configured to execute analog-to-digital conversion of a first input signal and a second input signal based on an analog-to-digital conversion characteristic curve to generate first digital data and second digital data respectively corresponding to the first input signal and the second input signal, the first input signal having a first level, the first level being the sum of an offset level and a level of a target analog signal for analog-to-digital conversion, the second input signal having a second level, the second level being generated by subtracting the offset level from the level of the target analog signal; and an obtaining unit configured to obtain difference digital data between the first digital data and the second digital data to output the obtained difference digital data as digital data of the target analog signal.

8. An analog-to-digital converter according to claim 7, wherein the generating unit comprises a first analog-to-digital conversion module and a second analog-to-digital conversion module, the first analog-to-digital conversion module comprising:

a pulse delay circuit composed of a plurality of delay units, the plurality of delay units operating based on the first level of the first input signal, the pulse delay circuit being configured to circulate a pulse signal through the plurality of delay units while the pulse signal is delayed thereby, a delay time of each of the plurality of delay units depending on the first level of the first input signal; and a generating circuit configured to count a number of the delay units through which the pulse signal has passed within a predetermined sampling period to generate the first digital data based on the counted number, and the second analog-to-digital conversion module comprises:

a pulse delay circuit composed of a plurality of delay units, the plurality of delay units operating based on the second level of the second input signal, the pulse delay circuit being configured to circulate a pulse signal through the plurality of delay units while the pulse signal is delayed thereby, a delay time of each of the plurality of delay units depending on the second level of the second input signal; and a generating circuit configured to count a number of the delay units through which the pulse signal has passed within a predetermined sampling period to generate the second digital data based on the counted number.

9. An analog-to-digital converter according to claim 8, wherein at least one of the first and second analog-to-digital conversion modules includes an adjusting unit configured to adjust the offset level.

10. An analog-to-digital converter according to claim 8, wherein the first analog-to-digital conversion module consists of a plurality of first analog-to-digital conversion modules, the second analog-to-digital conversion module consists of a plurality of second analog-to-digital conversion modules, and the obtaining unit consists of a plurality of obtaining units, the plurality of first analog-to-digital conversion modules, the second analog-to-digital conversion modules, and the obtaining modules constitute a plurality of analog-to-digital converting units each including one of the first analog-to-digital conversion modules, one of the second analog-to-digital conversion modules, and one of the obtaining units, further comprising:

an adder configured to add items of the digital data of the target analog data respectively obtained by the plurality of analog-to-digital converting units.

11. An analog-to-digital converter according to claim 8, wherein the first analog-to-digital conversion module comprises a plurality of first logic elements configured to perform logical operations to execute the analog-to-digital conversion of the first input signal, and the second analog-to-digital conversion module comprises a plurality of second logic elements structurally and operatively being equivalent to the plurality of first logic elements, respectively, the plurality of second logic elements being configured to perform logical operations to execute the analog-to-digital conversion of the second input signal based on the analog-to-digital conversion characteristic curve to generate the second digital data, further comprising:

a circuit board on which the first and second logical elements are mounted, the first logical elements and the second logical elements are axisymmetrically arranged to each other.

12. An analog-to-digital converter according to claim 8, wherein the first analog-to-digital conversion module consists of a plurality of first analog-to-digital conversion modules, the second analog-to-digital conversion module consists of a plurality of analog-to-digital conversion modules, and the obtaining unit further comprises:

a first adder configured to add items of the first digital data obtained by the plurality of first analog-to-digital conversion modules;

a second adder configured to add items of the second digital data obtained by the plurality of second analog-to-digital conversion modules; and a calculator configured to calculate difference digital data between the added items of the first digital data and the added items of the second digital data to output the calculated difference digital data as the digital data of the target analog signal.

13. An analog-to-digital converter according to claim 7, further comprising a selecting unit configured to sequentially select alternately, with intervals, one of the first input signal and the second input signal so that a sequentially selected alternately one of the first and second input signals is input to the generating unit, the generating unit executing:
the analog-to-digital conversion of the first input signal and the second input signal based on the analog-to-digital conversion characteristic curve to generate the first digital data and the second digital data, the first input signal and the second input signal being temporally adjacent to each other and selected by the selecting unit,
wherein the obtaining unit is configured to obtain difference digital data between the first digital data and the second digital data, the first digital data and the second digital data respectively corresponding to the first and second input signals temporally adjacent to each other.

14. An analog-to digital converter according to claim 7, further comprising:
a storing unit configured to, when a reference signal with a predetermined reference level is used as the target analog signal at a reference temperature, store therein the digital data of the reference signal at the reference temperature as first reference digital data;
a data obtaining unit configured to, when the reference signal with the predetermined reference level is used as the target analog signal at an arbitrary temperature except for the reference temperature, obtain the digital data of the reference signal therein at the arbitrary temperature as second reference digital data;
a dividing unit configured to divide, by the second reference digital data, the digital data of the target analog signal at the arbitrary temperature; and
a multiplying unit configured to multiply, by the first reference digital data, a quotient of the digital data of the target analog signal at the arbitrary temperature and the second reference digital data to correct the target analog signal at the arbitrary temperature.

15. An analog-to digital converter according to claim 7, wherein the analog-to-digital conversion characteristic curve is designed such that a predetermined definite range of the level of the target analog signal allows the analog-to-digital conversion characteristic curve to be approximated by a quadratic function, and the offset level is set within the certain definite range of the target analog signal.

16. An analog-to-digital converter comprising:
a generating unit configured to:
execute analog-to-digital conversion of a first input signal based on an analog-to-digital conversion characteristic curve to generate first digital data, the first input signal having a first level, the first level being the sum of an offset level and a level of a target analog signal for analog-to-digital conversion;
subtract the first level of the first input signal from double of the offset level to generate a second input signal; and
execute analog-to-digital conversion of the second input signal based on the analog-to-digital conversion characteristic curve to generate second digital data; and
an obtaining unit configured to obtain difference digital data between the first digital data and the second digital data to output the obtained difference digital data as digital data of the target analog signal.

17. An analog-to-digital converter according to claim 16, wherein the first input signal is a first voltage signal, the first level is a first voltage level, the second input signal is a second analog signal, the second level is a second voltage level, the offset level is an offset voltage level, and the generating unit comprises an analog-to-digital conversion module, the analog-to-digital conversion module comprising:
a pulse delay circuit composed of a plurality of delay units, the plurality of delay units:
operating in a first mode based on the first voltage level of the first voltage signal as a positive supply voltage so that the pulse delay circuit is configured to circulate a pulse signal through the plurality of delay units while the pulse signal is delayed thereby, a delay time of each of the plurality of delay units depending on the first voltage level of the first voltage signal; and
operating in a second mode based on the double of the offset voltage level as a positive power supply voltage and on the first voltage level of the first voltage signal as a negative power supply voltage so that the pulse delay circuit is configured to circulate a pulse signal through the plurality of delay units while the pulse signal is delayed thereby, a delay time of each of the plurality of delay units depending on a difference between the double of the offset voltage level and the first voltage level of the first voltage signal; and
a generating circuit configured to:
count a number of the delay units through which the pulse signal has passed within a predetermined sampling period in the first mode to generate the first digital data based on the counted number; and
count a number of the delay units through which the pulse signal has passed within a predetermined sampling period in the second mode to generate the second digital data based on the counted number.

18. An analog-to-digital converter according to claim 16, wherein the first input signal is a first voltage signal, the first level is a first voltage level, the second input signal is a second analog signal, the second level is a second voltage level, the offset level is an offset voltage level, and the generating unit comprises a first analog-to-digital conversion module and a second analog-to-digital conversion module,
the first analog-to-digital conversion module comprising:
a first pulse delay circuit composed of a plurality of delay units, the plurality of delay units operating based on the first voltage level of the first voltage signal as a positive power supply voltage so that the pulse delay circuit is configured to circulate a pulse signal through the plurality of delay units while the pulse signal is delayed thereby, a delay time of each of the plurality of delay units depending on the first voltage level of the first voltage signal; and
a first generating circuit configured to count a number of the delay units through which the pulse signal has passed within a predetermined sampling period in the first mode to generate the first digital data based on the counted number, and the second analog-to-digital conversion module comprising:
a second pulse delay circuit composed of a plurality of delay units, the plurality of delay units operating based on the double of the offset voltage level as a positive power supply voltage and on the first voltage level of the first voltage signal as a negative power supply voltage so that the pulse delay circuit is configured to circulate a pulse signal through the plurality of delay units while the pulse signal is delayed thereby, a delay time of each of the plurality of delay units depending on a difference between the double of the offset voltage level and the first voltage level of the first voltage signal; and a second generating circuit configured to count a number of the delay units through which the pulse signal has passed within a predetermined sampling period to generate the second digital data based on the counted number.

19. An analog-to-digital converter according to claim 18, wherein the first analog-to-digital conversion module consists of a plurality of first analog-to-digital conversion modules, the second analog-to-digital conversion module consists of a plurality of second analog-to-digital conversion modules, and the obtaining unit consists of a plurality of obtaining units, the plurality of first analog-to-digital conversion modules, the second analog-to-digital conversion modules, and the obtaining modules constitute a plurality of analog-to-digital converting units each including one of the first analog-to-digital conversion modules, one of the second analog-to-digital conversion modules, and one of the obtaining units, further comprising:

an adder configured to add items of the digital data of the target analog data respectively obtained by the plurality of analog-to-digital converting units.

20. An analog-to-digital converter according to claim 18, wherein the first analog-to-digital conversion module consists of a plurality of first analog-to-digital conversion modules, the second analog-to-digital conversion module consists of a plurality of analog-to-digital conversion modules, and the obtaining unit further comprises:

a first adder configured to add items of the first digital data obtained by the plurality of first analog-to-digital conversion modules;

a second adder configured to add items of the second digital data obtained by the plurality of second analog-to-digital conversion modules; and a calculator configured to calculate difference digital data between the added items of the first digital data and the added items of the second digital data to output the calculated difference digital data as the digital data of the target analog signal.

21. An analog-to-digital converter according to claim 18, wherein the first analog-to-digital conversion module comprises a plurality of first logic elements configured to perform logical operations to execute the analog-to-digital conversion of the first input signal, and the second analog-to-digital conversion module comprises a plurality of second logic elements structurally and operatively being equivalent to the plurality of first logic elements, respectively, the plurality of second logic elements being configured to perform logical operations to execute the analog-to-digital conversion of the second input signal based on the analog-to-digital conversion characteristic curve to generate the second digital data, further comprising:

a circuit board on which the first and second logical elements are mounted, the first logical elements and the second logical elements are axisymmetrically arranged to each other.

22. An analog-to-digital converter according to claim 17, further comprising a selecting unit configured to sequentially select alternately, with intervals, the first voltage signal and the double of the offset voltage level as the positive supply voltage so that a sequentially selected alternately one of the first voltage signal and the double of the offset level is input to the generating unit, the first voltage signal being input to the generating unit as negative power supply voltage when the double of the offset voltage is selected by the selecting unit, the generating unit executing:

the analog-to-digital conversion of the first voltage signal and a difference between the double of the offset voltage level and the first voltage level of the first voltage signal based on the analog-to-digital conversion characteristic curve to generate the first digital data and the second digital data, the first voltage signal and the double of the offset voltage level being temporally adjacent to each other and selected by the selecting unit, wherein the obtaining unit is configured to obtain difference digital data between the first digital data and the second digital data, the first digital data and the second digital data respectively corresponding to the first input signal and the double of the offset voltage level temporally adjacent to each other.

23. An analog-to-digital converter according to claim 22, wherein the target analog signal fluctuates at a first cycle, and the selecting unit is configured to sequentially select alternately, at a second cycle, one of the first voltage signal and the double of the offset voltage level as the positive supply voltage, the second cycle being equal to or lower than one quarter of the first cycle.

24. An analog-to digital converter according to claim 17, further comprising:

a storing unit configured to, when a reference signal with a predetermined reference level is used as the target analog signal at a reference temperature, store therein the digital data of the reference signal at the reference temperature as first reference digital data;

a data obtaining unit configured to, when the reference signal with the predetermined reference level is used as the target analog signal at an arbitrary temperature except for the reference temperature, obtain the digital data of the reference signal therein at the arbitrary temperature as second reference digital data;

a dividing unit configured to divide, by the second reference digital data, the digital data of the target analog signal at the arbitrary temperature; and a multiplying unit configured to multiply, by the first reference digital data, a quotient of the digital data of the target analog signal at the arbitrary temperature and the second reference digital data to correct the target analog signal at the arbitrary temperature.

25. An analog-to digital converter according to claim 17, wherein the analog-to-digital conversion characteristic curve is designed such that a predetermined definite range of the level of the target analog signal allows the analog-to-digital conversion characteristic curve to be approximated by a quadratic function, and the offset level is set within the certain definite range of the target analog signal.

* * * * *